United States Patent
Kagawa et al.

(10) Patent No.: US 7,923,674 B2
(45) Date of Patent: Apr. 12, 2011

(54) SOLID-STATE IMAGE SENSOR HAVING A VOLTAGE APPLIER AND SIGNAL READOUT METHOD THEREOF

(75) Inventors: Keiichiro Kagawa, Ikoma (JP); Jun Ohta, Ikoma (JP)

(73) Assignee: National University Corporation Nara Institute of Science and Technology, Ikoma-Shi (JP)

( * ) Notice: Subject to any disclaimer, the term of this patent is extended or adjusted under 35 U.S.C. 154(b) by 644 days.

(21) Appl. No.: 11/922,592

(22) PCT Filed: Jun. 6, 2006

(86) PCT No.: PCT/JP2006/311313
§ 371 (c)(1),
(2), (4) Date: Dec. 20, 2007

(87) PCT Pub. No.: WO2007/000879
PCT Pub. Date: Jan. 4, 2007

(65) Prior Publication Data
US 2010/0019127 A1    Jan. 28, 2010

(30) Foreign Application Priority Data

Jun. 29, 2005 (JP) .................................. 2005-189314

(51) Int. Cl.
*H01L 27/00* (2006.01)
(52) U.S. Cl. ..................................... 250/208.1; 340/307
(58) Field of Classification Search ............... 250/208.1; 340/241, 250, 307
See application file for complete search history.

(56) References Cited

U.S. PATENT DOCUMENTS

| 6,642,494 B1 * | 11/2003 | Endo ........................... 250/208.1 |
| 6,642,495 B2 * | 11/2003 | Lowrance et al. ......... 250/208.1 |
| 6,697,113 B1 * | 2/2004 | Tanaka et al. ................. 348/308 |
| 6,803,952 B1 * | 10/2004 | Watanabe ...................... 348/241 |
| 2001/0020909 A1 | 9/2001 | Sakuragi et al. |

FOREIGN PATENT DOCUMENTS

| JP | A 10-269345 | 10/1998 |
| JP | A 2001-346102 | 12/2001 |
| JP | A 2001-346106 | 12/2001 |
| JP | A 2005-198149 | 7/2005 |

OTHER PUBLICATIONS

Shouho et al., "A Low-Voltage Pulse-Width-Modulation Image Sensor", CCD & AIS, Jun. 9, 2005.

* cited by examiner

*Primary Examiner* — Seung C Sohn
(74) *Attorney, Agent, or Firm* — Oliff & Berridge, PLC

(57) ABSTRACT

After resetting the potential VPD of the photodiode (11) to the predetermined potential VRST, light is incident onto the photodiode (11) for a predetermined period to decrease the VPD corresponding to the amount of the incident light. After that, a declivous ramp voltage VRAMP is applied to the source terminal of the first MOS transistor (12) which is a common-source amplifier for reading out the VPD. When the voltage difference between the gate and source of the MOS transistor (12) exceeds a threshold voltage, the MOS transistor is turned on and the output suddenly decreases. If a signal having a pulse width from the starting point of the sweep of the ramp voltage to the sudden lowering point of the output is generated, the pulse width depends on the amount of the incident light. With the signal readout of this PWM method, it is possible to lower the power consumption while a wide dynamic range is maintained, and to downsize the picture cells to achieve a higher number of picture cells.

19 Claims, 11 Drawing Sheets

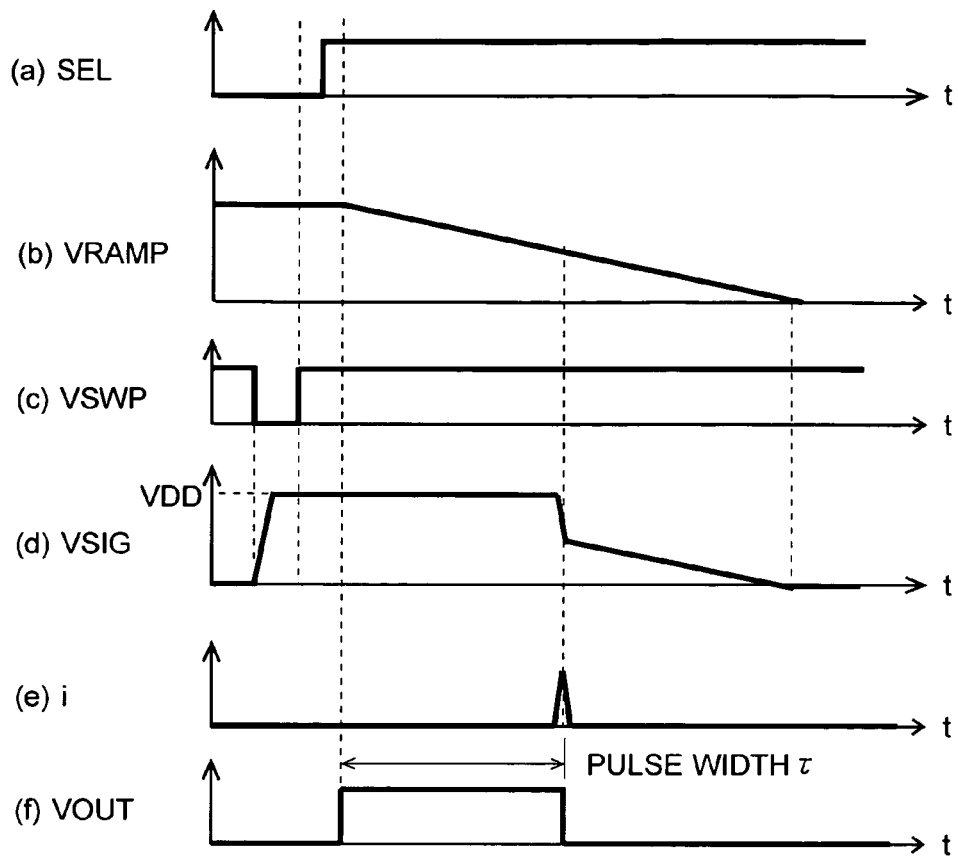
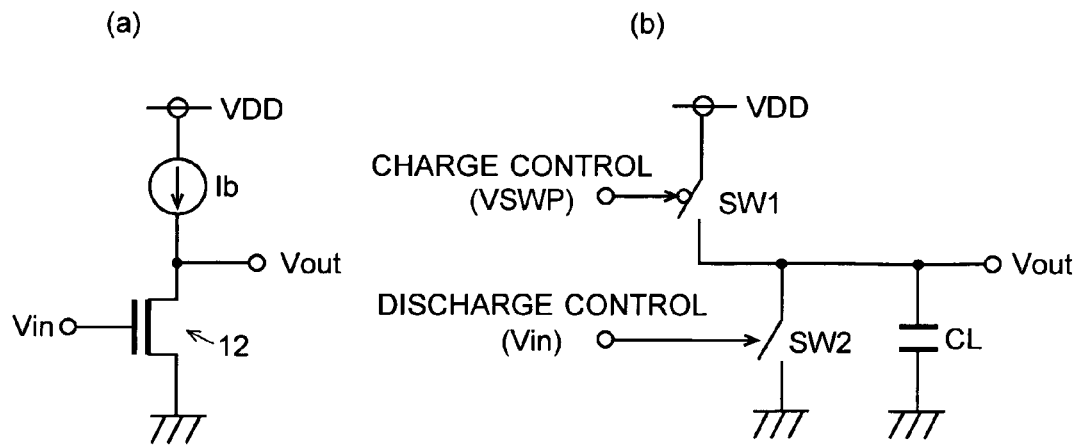

SOLID-STATE IMAGE SENSOR HAVING A VOLTAGE APPLIER AND SIGNAL READOUT METHOD THEREOF

TECHNICAL FIELD

The present invention relates to a solid-state image sensor for detecting the intensity of light coming from subjects to be photographed and for outputting such light as electrical signals. The present invention also relates to a signal readout method of the solid-state image sensor.

BACKGROUND ART

Two major methods for an image sensor (solid-state image sensor) already in practical use are the CCD method and the CMOS method. Both methods are primarily different in the structure and operation when pixel signals are read out. However, the two methods are similar in converting light intensity into electrical signals; photocarriers (photo-generated electric charges) generated in a light-receiving element within a picture cell in a given period of time (several msecs to a few secs in general) are accumulated, and then the amount of the accumulated electric charge is directly or indirectly detected. Although the CCD method, which has an advantage in enhancing sensitivity and density growth, has been dominant conventionally, the CMOS method, which has an advantage in low power consumption and single-chip integration with image processing circuits or the like in subsequent stages, is recently getting more and more prevalent.

As for such CMOS image sensors, a major conventionally known method of detecting light intensity is described with reference to FIGS. 12 and 13. FIG. 12 illustrates an example of waveforms for explaining the difference between the various signal read-out methods of conventional and general image sensors. FIG. 13 illustrates an example of voltage waveforms of a vertical signal line of a certain column.

(1) Active Pixel Sensor (APS) Method

Initially, a photodiode potential is reset to a reset potential VRST by applying a given inverse voltage at a certain point in time to a p-n junction diode (photodiode). Subsequently, when light falls on the photodiode, photocarriers are generated and an electric current flows to discharge the photodiode, resulting in the reduction of the photodiode potential. Since the discharge current at this time depends on the intensity of the incident light, the higher the intensity of the incident light is, the higher the potential reduction rate becomes. Based on this incident, as shown in FIG. 12(*a*), photodiode potential V1 is detected at the time when a predetermined time t1 has elapsed after the reset is finished, and the decreased amount (the discharged amount) from the reset potential VRST is obtained. The decreased amount of the potential will be a brightness signal reflecting the intensity of the incident light (see FIG. 13(*a*)). With this method, it is possible to increase the detection sensitivity by elongating the time t1 from when a photodiode potential is reset until the decreased amount of the potential is detected (i.e. the electric charge accumulation time), because the potential difference increases greatly when the detection is carried out even if the incident light is weak. With this configuration, the dynamic range is given by a ratio of the amplitude of the saturating signal to the total amount of the noise such as that of a readout circuit or that caused by the resetting operation. If the supply voltage decreases, the dynamic range is also reduced since the amplitude of the saturating signal decreases.

(2) Pulse Width Modulation (PWM) Method

In the case where a pixel value is read out with the PWM method within a readout period after a predetermined accumulation period, a ramp-shaped voltage change $\Delta V$ is applied to a photodiode potential in some way. Then, the time period from when the photodiode potential decreases to a predetermined reference voltage VREF until a predetermined time has elapsed after the starting point of the ramp-shaped voltage change is detected as the width of a pulse signal. Therefore, as illustrated in FIGS. 12(*b*) and 13(*b*), if the amount of the incident light during the accumulation period is large and the discharge amount is also large (i.e. in the case where the photodiode potential is relatively low at the point of time when the accumulation period is finished as shown by VPD' in FIG. 12(*b*)), the pulse width additionally becomes large (e.g. t2' in FIG. 12(*b*)). If the amount of the incident light during the accumulation period is weak and the discharge amount is small (i.e. in the case where the photodiode potential is relatively high at the point of time when the accumulation period is finished as shown by VPD in FIG. 12(*b*)), the pulse width ultimately becomes small (e.g. t2 in FIG. 12(*b*)). In these cases, at or after the point of time when the predetermined time has elapsed after the starting point of the ramp-shaped voltage change, the subsequent reset is performed as described earlier. With this method, the dynamic range is given by a ratio of the readout period per one picture cell by the PWM method to the jitter of a readout circuit. This can be rewritten by a ratio of the amplitude of the saturating signal of a photodiode to the equivalent input noise of the readout circuit, and the dynamic range can be expanded by the gain of the amplifier of a readout circuit. Therefore, this method is resistant to the reduction of a supply voltage compared to the APS method.

Recently, the CMOS image sensors are widely coming into use, e.g. in an imaging device for a camera-equipped mobile phone. In the image sensors used for such purpose, using less power as well as having a high number of picture cells are both very important. One effective method to lower the power consumption is to reduce the supply voltage. However, in general, when the supply voltage is reduced, the noise factor is not reduced while the maximum amplitude is reduced in the photoelectric conversion element in an image sensor. Therefore, the S/N ratio and the dynamic range are reduced.

As described earlier, the signal readout by the PWM method is effective in expanding the dynamic range compared to the APS method. However, in a conventionally known signal readout circuit using a source follower amplifier, it is inevitable that the dynamic range is reduced when the supply voltage is reduced. To address this problem, Non-Patent Document 1 and Patent Document 2 suggest image sensors with the aim of lowering the power consumption while maintaining the dynamic range. FIG. 14 is a configuration diagram of a suggested picture cell in an image sensor, and FIG. 15 is a timing chart showing the readout operation by the image sensor in FIG. 14.

The anode terminal of the photodiode 81 which generates the signal electric charge corresponding to the intensity of incident light is grounded. A capacitor 82 is connected between the cathode terminal and the ramp voltage signal line 86. The input terminal of the amplifier 83 is connected to the connection point of the cathode terminal of the photodiode 81 and the capacitor 82. The output terminal of the amplifier 83 is connected to the vertical signal line 89 via the MOS transistor 85 for output selection. A MOS transistor 84 for resetting is connected between the input terminal and the output terminal of the amplifier 83. The gate terminal of the MOS transistor 84 is connected to the reset signal line 87, and the gate terminal of the MOS transistor 85 is connected to the row selection signal line 88.

The signal readout operation carried out with this picture cell is hereinafter described. First, the MOS transistor 84 is turned on by the reset signal RST supplied to the reset signal line 87, and the potential of the cathode terminal of the photodiode 81 (photodiode potential), VPD, is set to the reset potential VRST (see FIGS. 15(c) and (d)). After the reset, a predetermined voltage is applied to the ramp voltage signal line 86, and then the photodiode potential VPD is raised to VRST+$\Delta$V via the capacitor 82. Then, when light is allowed to fall on the photodiode 81, the voltage VPD gradually decreases by the photocurrent generated in the photodiode 81 as shown by the dotted line in FIG. 15(d). When a predetermined accumulation period is finished, the voltage VPD is reduced by $\Delta$VSIG from the starting point of the accumulation period. That is, the photodiode potential VPD as of then is VRST+$\Delta$V−$\Delta$VSIG.

After that, the ramp voltage VRAMP which is applied to a terminal of the capacitor 82 is decreased from a predetermined voltage at a constant rate (see FIG. 15(a)). Then the photodiode potential VPD is also decreased in proportion to the ramp voltage VRAMP via the capacitor 82. Specifically, if the capacitance of the capacitor 82 is denoted by Cramp, the junction capacitance of the photodiode 81 which is connected in series with the capacitance Cramp is denoted by Cpd, and the voltage change of the ramp voltage VRAMP is denoted by $\Delta$Vramp, the voltage change $\Delta$Vpd of the photodiode potential VPD will be {Cramp/(Cramp+Cpd)}×$\Delta$Vramp. When the photodiode potential VPD crosses the threshold voltage Vth, the output is inverted and a binary signal having a pulse width according to the amount of incident light is provided (see FIG. 15(e)).

A circuit having such a configuration can be operated with a supply voltage of approximately 1[V] and the low power consumption is therefore achieved. In addition, since the gain of the amplifier is large, the equivalent input noise can be significantly reduced compared to the conventional configuration using a source follower amplifier in a readout circuit. Therefore, the high dynamic range is also achieved. Meanwhile, such an image sensor as described in the aforementioned Non-Patent Document 2 will hereinafter be called a low-voltage PWM image sensor in order to distinguish it from conventional PWM image sensors.

However, the low-voltage PWM image sensor with the conventional circuit configuration as described earlier requires a capacitor 82, which is charged by a ramp voltage, within every picture cell. In a semiconductor chip, a capacitor is an element occupying a far larger space than a transistor or other elements. Inevitably, the size of a picture cell becomes significantly large. According to an estimate by the inventors of the present invention, the size of a picture cell of such a configuration in which a picture cell includes a capacitor as described earlier is approximately four times larger than that of what is called 3Tr-type APS circuit in which one picture cell includes three MOS transistors. Therefore increasing the number of picture cells is difficult. And, to keep the same number of picture cells, the cost might be increased since the area of a semiconductor chip becomes large.

In the low-voltage PWM image sensor described in the aforementioned Non-Patent Document 1, there are two possible configurations as for an amplifier 83; one is to use one source-grounded MOS transistor, and the other is to use an inverter amplifier of a CMOS configuration in which a PMOS transistor and an NMOS transistor are incorporated. The former configuration has an advantage in the reduction of the size of a picture cell over the latter configuration because the number of transistors in a picture cell is one less. However, when the photodiode potential VPD is higher than the threshold voltage Vth of the source-grounded MOS transistor, a constant bias current flows into the transistor. In the PWM method, the key point is the timing of the changing point when the output of the amplifier 83 is inverted. In the aforementioned circuit, a bias current constantly flows while the source-grounded MOS transistor is in an on-state. Since the power consumption regarding this condition does not directly contribute to the acquisition of the required information, it can be regarded as wasted power consumption. That is, the former configuration has a disadvantage in reducing the power consumption.

On the other hand, in the case where the latter configuration, i.e. an inverter amplifier of a CMOS configuration, is used, an electric current flows only in a transient state in which the output varies, and a bias current does not flow in a static state in which the output is fixed. Therefore, it has an advantage in the power consumption. At the same time, it has a disadvantage in the reduction of the size of a picture cell since it requires two transistors as an amplifier 83. In addition, in an inverter amplifier of a CMOS configuration, a through current flows from the power supply side to the ground side when an output change occurs, while no constant bias current flows as described earlier. Therefore, under the condition that the time period when the gate-source voltage is around the threshold voltage Vth is long, e.g. in the case where the slew rate of the ramp voltage is low or in the case where the width of the transition range of the CMOS inverter amplifier is wide, there is a possibility that the power consumption by the through current may increase to a significant level. Hence, if the power consumption by a through current can be reduced, it is possible to further achieve lower power consumption more than ever before.

[Patent Document 1] Japanese Unexamined Patent Application Publication No. H10-269345

[Patent Document 2] Japanese Unexamined Patent Application Publication No. 2005-198149

[Non-Patent Document 1] M. Shouho, K. Hashiguchi, K. Kagawa and J. Ohta, A Low-Voltage Pulse-Width-Modulation Image Sensor. 2005 CCD & AIS, Jun. 9, 2005

DISCLOSURE OF THE INVENTION

Problem to be Solved by the Invention

The present invention is made to solve the above-described problem. The first objective of the present invention is to provide a solid-state image sensor and its signal readout method for achieving low power consumption as well as for maintaining a wide dynamic range, and additionally for decreasing the size of a picture cell to have an advantage in increasing the number of picture cells and also incorporating other circuits.

The second objective of the present invention is to provide a solid-state image sensor and its signal readout method for further achieving lower power consumption compared to the conventional low-voltage PWM image sensors as described earlier.

Means for Solving the Problems

To achieve the first objective, the first aspect of the present invention provides a solid-state image sensor including:

a) a photoelectric converter for generating a signal electric charge corresponding to an intensity of incident light and for holding a potential thereof;

b) an amplifier unit including a first MOS transistor in which a gate terminal is connected to read out a held potential by the photoelectric converter and a drain terminal serves as an output terminal;

c) a voltage applier for applying a ramp waveform voltage to a source terminal of the first MOS transistor; and d) a signal converter for generating a binary signal having a pulse width corresponding to the held potential based on an output of the first MOS transistor when the ramp waveform voltage is applied to the source terminal of the first MOS transistor by the voltage applier while a potential to be read out is held in the photoelectric converter.

In the first embodiment of the first aspect of the present invention, the amplifier unit may be an amplifier in which the first MOS transistor is an N-type or P-type transistor with its source grounded. And, in the second embodiment of the first aspect of the present invention, the amplifier unit may be a CMOS inverter amplifier in which a reverse polarity MOS transistor is further added to a side of the drain terminal of the first MOS transistor which is an N-type or P-type transistor.

The second aspect of the present invention to achieve the aforementioned first objective is a signal readout method of the solid-state image sensor according to the first aspect of the present invention, including a photoelectric converter for generating a signal electric charge corresponding to an intensity of incident light and for holding a potential thereof; an amplifier unit including a first MOS transistor in which a gate terminal is connected to read out a held potential by the photoelectric converter and a drain terminal serves as an output terminal; and a signal converter for generating a binary signal corresponding to an intensity of incident light based on an output of the first MOS transistor, where:

a ramp waveform voltage is started to be applied to a source terminal of the first MOS transistor, while a potential, which is to be read out, corresponding to the intensity of the incident light is held in the photoelectric converter; and a binary signal having a pulse width corresponding to the held potential is generated by the signal converter based on the change of the output of the first MOS transistor accompanying a change of the ramp waveform voltage.

To achieve the second objective, the third aspect of the present invention provides a solid-state image sensor, including:

a) a photoelectric converter for generating a signal electric charge corresponding to an intensity of incident light and for holding a potential thereof;

b) an amplifier unit including a first MOS transistor in which a gate terminal is connected to an output terminal of the photoelectric converter to read out a held potential by the photoelectric converter and a drain terminal serves as an output terminal;

c) a voltage applier for applying a ramp waveform voltage to a source terminal of the first MOS transistor or to the output terminal of the photoelectric converter via a capacitative element;

d) a second MOS transistor connected between an output signal line for providing an output signal of the amplifier unit and a power supply line;

e) a charge controller, which is a circuit for applying a control voltage to a gate terminal of the second MOS transistor, for charging a stray capacitance whose one end is connected to the signal line by providing electrical conduction of the second MOS transistor before the ramp waveform voltage is applied; and f) a signal converter for generating a binary signal having a pulse width corresponding to the held potential based on a voltage on the output signal line, the voltage being changed by discharging a charged electric charge of the stray capacitance via the first MOS transistor, when the ramp waveform voltage is applied to the source terminal of the first MOS transistor or to the output terminal of the photoelectric converter via the capacitative element by the voltage applier while a potential to be read out is held in the photoelectric converter.

The fourth aspect of the present invention to achieve the second objective is a signal readout method of the solid-state image sensor according to the third aspect of the present invention, including a photoelectric converter for generating a signal electric charge corresponding to an intensity of incident light and for holding a potential thereof; an amplifier unit including a first MOS transistor in which a gate terminal is connected to an output terminal of the photoelectric converter to read out a held potential by the photoelectric converter and a drain terminal serves as an output terminal; a voltage applier for applying a ramp waveform voltage to a source terminal of the first MOS transistor or to the output terminal of the photoelectric converter via a capacitative element; a second MOS transistor connected between an output signal line for providing an output signal of the amplifier unit and a power supply line; and a signal converter for generating a binary signal having a pulse width corresponding to the held potential based on a voltage on the output signal line, where:

a stray capacitance whose one end is connected to the signal line is charged by applying a predetermined control voltage to a gate terminal of the second MOS transistor to provide electrical conduction of the second MOS transistor before the ramp waveform voltage is applied by the voltage applier and while a potential, which is to be read out, corresponding to an intensity is held in the photoelectric converter; after that, a ramp waveform voltage is started to be applied to the source terminal of the first MOS transistor or to the output terminal of the photoelectric converter via the capacitative element by the voltage applier; and a binary signal having a pulse width corresponding to the held potential is generated by the signal converter based on the voltage on the signal line, the voltage being changed by discharging a charged electric charge of the stray capacitance via the first MOS transistor in a changing process of the ramp waveform voltage.

Effects of the Invention

In the solid-state image sensor or its signal readout method according to the first through fourth aspects of the present invention, the photoelectric converter is, typically, a photodiode. A photodiode with its anode terminal grounded for example generates, when incident light falls on it, signal charges corresponding to the light intensity. This causes a photodiode potential VPD at the cathode terminal. In the solid-state image sensor of the first embodiment, the photodiode potential VPD is applied to the gate terminal of the first MOS transistor with the source grounded. Therefore the transistor is in an off-state while the potential of the source terminal is lower than the potential of VPD minus a threshold voltage Vth. Hence, the output voltage on a signal line (vertical signal line) connected to the drain terminal of the first MOS transistor via a transistor for output selection is normally equal to, for example, the supply voltage.

On applying a declivous ramp waveform voltage by the voltage applier in this state for example, when the voltage applied to the source terminal decreases and the potential difference between the gate and source exceeds the threshold voltage, the first MOS transistor is turned on and the output voltage on the aforementioned vertical signal line rapidly decreases to a level near the ramp waveform voltage. The time period from the starting point of the voltage change of the ramp waveform voltage until the rapid change of the output of the first MOS transistor depends on the original potential of the gate, i.e. the photodiode potential VPD. Therefore, this corresponds to the amount of signal electric charges generated corresponding to the light intensity of the incident light. The signal converter generates a binary signal having a pulse width between the starting point of the voltage change of the ramp waveform voltage and the rapid change of the output of the first MOS transistor for example. Since this pulse width changes in accordance with the amount of light received, it is possible to obtain a pulse-width-modulated signal.

As just described, with the solid-state image sensor according to the first aspect of the present invention, and with the signal readout method of the solid-state image sensor according to the second aspect of the present invention, there is no necessity to place a capacitor for controlling a photodiode potential by capacitative coupling in a picture cell as in the conventional way. As mentioned earlier, a capacitor is generally an element occupying a far larger space than a MOS transistor or other elements on a semiconductor chip. Therefore, the size of a picture cell will be dramatically decreased because a capacitor is not necessary within a picture cell. This accomplishes low power consumption, high dynamic range, and a high number of picture cells. Alternatively, if the number of picture cells is kept as large as ever, it is possible to decrease the size of an element by decreasing the size of one picture cell. This can lead to a cost reduction, or heightening the functions by mounting one or more circuits of other functions (e.g. an image processing circuit) onto a single semiconductor chip.

In the case where a mere source-grounded MOS transistor is used as the amplifier unit as in the first embodiment, an electric current continuously flows while the MOS transistor is in an on-state. Accordingly this has a disadvantage for low power consumption. On the other hand, in the case where the amplifier unit is a CMOS inverter amplifier as in the second embodiment, an electric current only flows for a limited period of time when the output of the inverter changes. Therefore, this has a great advantage in lowering the power consumption, although this has a disadvantage in decreasing the size of a picture cell because one transistor is added.

The solid-state image sensor according to the first aspect of the present invention may be a solid-state image sensor, where picture cells are arranged in a two-dimensional matrix of n-rows and m-columns, and each picture cell includes the photoelectric converter and the amplifier unit and each picture cell further includes at least a second MOS transistor for resetting the held potential of the photoelectric converter and a third CMOS transistor for an output selection to decide whether or not an output voltage of the first MOS transistor is provided to a signal line (vertical signal line) shared by plural picture cells.

In this case, it is preferable that the signal line be shared by all n picture cells belonging to one column, and the signal converter be placed in every column.

With this configuration, three transistors at a minimum other than a photodiode are placed in one picture cell. Hence, the size of a picture cell is as small as a 3Tr-type readout circuit of the APS method. As described earlier, even in the case where the amplifier unit is a CMOS inverter amplifier, the size of a picture cell is as small as a 4Tr-type readout circuit of the APS method.

The solid-state image sensor according to the first aspect of the present invention may be a solid-state image sensor, where:
picture cells are arranged in a two-dimensional matrix of n-rows and m-columns;
each picture cell includes the photoelectric converter and an output gate circuit for selectively providing the held potential of the photoelectric converter; and
plural adjoining or adjacent picture cells shares the amplifier unit, a second MOS transistor for resetting the held potential of the photoelectric converters within the plural picture cells, and a third MOS transistor for an output selection to decide whether or not an output voltage of the first MOS transistor is provided to a signal line shared by plural picture cells.

With this configuration, the number of transistors per a picture cell can be reduced compared to the case where the first through third MOS transistors are placed in each picture cell. Therefore, this enables the size reduction of a picture cell, and has an advantage in increasing the number of picture cells.

The solid-state image sensor according to the first aspect of the present invention may be a solid-state image sensor, where the signal converter includes:
a waveform shaper for generating a voltage signal obtained by subtracting a voltage corresponding to the ramp waveform voltage from the output voltage of the first MOS transistor; and
a comparison element for binarizing an output voltage of the waveform shaper by performing a determination based on a predetermined decision threshold.

In the solid-state image sensor according to the first aspect of the present invention, the potential of the source terminal of the first MOS transistor for readout is changed into the ramp waveform shape as described earlier. Hence, the low level of the output voltage is changed in the same way as if an offset is given. In the above-described configuration, the offset's voltage is first removed by the waveform shaper in the signal converter and the low level becomes flat (i.e. maintains a nearly-constant potential). This facilitates the setting of the judgment threshold for binarization by the comparison element in the next step.

It is also possible, of course, to perform a binarization by setting the judgment threshold within a range which is not affected by the low level having a ramp waveform shape, without performing such a waveform shaping.

One specific embodiment of the first aspect of the present invention may be a solid-state image sensor, where:
the first MOS transistor is an N-type transistor; and
upon resetting the held potential of the photoelectric converter, the voltage applier applies a voltage VH1, which is not a lowest potential of this element, to the source terminal of the first MOS transistor to initialize a potential of the photoelectric converter to a reset potential VRST which is approximately a potential higher than the voltage VH1 by a threshold voltage of the MOS transistor or approximately the threshold voltage, and the voltage applier applies a declivous ramp waveform voltage.

With this configuration, a signal voltage amplitude of the photodiode can be increased as large as possible under the condition that the relationship between the reset voltage VRST and the voltage VH1 is VRST>VH1. Therefore, this has an advantage in maintaining a wide dynamic range with a low supply voltage.

In this configuration, it is preferable that the voltage applier apply a voltage VH2 which is higher than the voltage VH1 to the source terminal of the first MOS transistor when the held potential is decreased from the reset potential VRST by generating a signal electric charge corresponding to an intensity of incident light after the held potential during an accumulation period of the photoelectric converter is set to the reset potential VRST.

This makes the first MOS transistor completely in an off-state during the electric charge accumulation period, and the subthreshold leak of the MOS transistor is therefore reduced. This enhances the accuracy of the photodiode potential, and therefore, the picture quality is improved based on this enhancement.

In another embodiment of the first aspect of the present invention, the held potential of the photoelectric converter may be reset by a voltage VH3 which is higher than the maximum voltage VH1 (however, lower than the voltage VH2) of the ramp wave. With this configuration, the output voltage is quickly inverted during the readout period, and therefore the lost time in the PWM readout (time period for the dark signal voltage to reach the reference voltage VREF) can be reduced.

In addition, a P-type transistor may be used for the first MOS transistor from the same perspective. That is, the first MOS transistor is a P-type transistor; and upon resetting the held potential of the photoelectric converter, the voltage applier applies a voltage VH1, which is not a highest potential of this element, to the source terminal of the first MOS transistor to initialize a potential of the photoelectric converter to a reset potential VRST which is approximately a potential lower than the voltage VH1 by an absolute value of a threshold voltage of the MOS transistor or approximately the threshold voltage, and the voltage applier applies an acclivitous ramp waveform voltage.

In this configuration, the voltage applier may apply a voltage VH2 that is lower than the voltage VH1 to the source terminal of the first MOS transistor when the held potential is increased from the reset potential VRST by generating a signal electric charge corresponding to an intensity of incident light after the held potential during an accumulation period of the photoelectric converter is set to the reset potential VRST. This configuration also has an advantage in maintaining a wide dynamic range with a low supply voltage as in the case where the first MOS transistor is an N-type.

In the solid-state image sensor according to the first aspect of the present invention, it is preferable that at least a MOS transistor included in the amplifier unit be placed on an SOI (Silicon on Insulator) substrate.

As stated earlier, in the case where a source potential of a source-grounded MOS transistor is changed, the threshold voltage of the MOS transistor itself changes by the substrate bias effect, and this will be a factor of a nonlinear error when pixel values are read out by a pulse width modulation method. If a MOS transistor is placed on an SOI substrate, the substrate bias effect does not occur; therefore such nonlinearity as described earlier will be improved and the accuracy enhancement can be expected. Even in this configuration, it is preferable, in terms of sensitivity, that a photodiode itself be placed not on an SOI substrate but on a bulk substrate, or that the photodiode use a thick SOI layer which the photodiode is placed on.

In the solid-state image sensor according to the third aspect of the present invention, and in the signal readout method of the solid-state image sensor according to the fourth aspect of the present invention, the second MOS transistor, which is connected between an output signal line such as a vertical signal line for providing the output signal of an amplifier unit in a picture cell and a power supply line, is used not as a load current source or a load resistance but as a control switch for charging the stray capacitance with its one end connected to the output signal line. Therefore, the charge controller applies a predetermined control voltage to the gate terminal of the second MOS transistor while a potential to be read out corresponding to the intensity of incident light is held in the photoelectric converter and before the ramp waveform voltage is applied, to put the MOS transistor in an on-state. Then the potential of the output signal line rises to that of the power supply line, and the stray capacitance is charged. When the first MOS transistor and the second MOS transistor are in an off-state, the charged potential of the stray capacitance is held.

After this, a ramp waveform voltage begins to be applied to the source terminal of the first MOS transistor or to the output terminal of the photoelectric converter via the capacitative element. In the process of the change of the ramp waveform voltage, when the voltage between the source terminal and the gate terminal of the first MOS transistor exceeds the threshold voltage Vth, the first MOS transistor is turned on, and the charged potential of the stray capacitance is discharged through the MOS transistor. Since this significantly changes the voltage on the output signal line, the signal converter generates a binary signal having a pulse width corresponding to the held potential of the photoelectric converter based on this voltage change.

In this configuration, only a transitional electric current flows in the MOS transistor in the amplifier unit when the electric charge is discharged from the stray capacitance, and no constant bias current flows. In addition, since the amount of the transitional current does not exceed the charged amount, its current value is small compared to the through current that flows when the output change of the inverter amplifier of a CMOS configuration occurs. Therefore, even in the case where one MOS transistor is used as the amplifier unit in the solid-state image sensor according to the first aspect of the present invention, it is possible to avoid the constant flow of the bias current when the output change does not occur. This achieves both the reduction in size of a picture cell and low power consumption. In addition, even in the case where an inverter amplifier of a CMOS configuration is used as the amplifier unit, it is possible to reduce the flow of electric currents more than ever before, to achieve lower power consumption.

In the solid-state image sensor according to the third aspect of the present invention and in the signal readout method of the solid-state image sensor according to the fourth aspect of the present invention, a configuration of applying a ramp waveform voltage to the source terminal of the first MOS transistor corresponds to a configuration of the solid-state image sensor according to the aforementioned first aspect of the present invention. On the other hand, a configuration of applying a ramp waveform voltage to the output terminal of the photoelectric converter via the capacitive element corresponds to a conventional low-voltage PWM image sensor which was described earlier. That is, the third and the fourth aspects of the present invention can be applied to any type of low-voltage PWM image sensor, to achieve lower power consumption.

"A ramp waveform" in each aspect of the present invention described earlier includes not only a waveform which linearly changes over time, i.e. a waveform expressed by $V=A \cdot X$, where X is the time and A is the proportional constant, but also a waveform which is proportional to a power of time, e.g. one expressed by $V=A \cdot X^{\gamma}$. Moreover, it also includes a waveform in which a predetermined offset value (B) is initially set, e.g. one expressed by $V=A \cdot X+B$ or $V=A \cdot X^\gamma+B$.

BRIEF DESCRIPTION OF THE DRAWINGS

FIG. 8 is a timing chart for explaining a PWM signal converting operation in the image sensor of the fourth embodiment.

FIG. 9 is a diagram for explaining the signal readout principle in the image sensor of the fourth embodiment.

EXPLANATION OF NUMERALS

1 . . . Image Cell Unit
10, 10a, 10b, 10c, 10d . . . Picture Cell
11, 111, 112, 113, 114 . . . Photodiode
12, 13, 14, 19, 43, 201, 202, 203, 204 . . . MOS Transistor
15 . . . Reset Signal Line
16 . . . Row Selection Signal Line
17 . . . Ramp Voltage Signal Line
18 . . . Vertical Signal Line
20 . . . Pixel Unit
2 . . . Row Selection Decoder
3 . . . Ramp Voltage Generating Circuit
4 . . . Comparator Circuit
41 . . . Differential Amplifier
42 . . . Comparator
5 . . . Condition Judging Circuit
6 . . . Memory Circuit
7 . . . Column Selection Decoder
8 . . . Gray-Code Counter
20 . . . Timing Control Circuit 21 . . . Bias Circuit
22 . . . Charge Control Circuit

BEST MODES FOR CARRYING OUT THE INVENTION

First Embodiment

Figure 1:
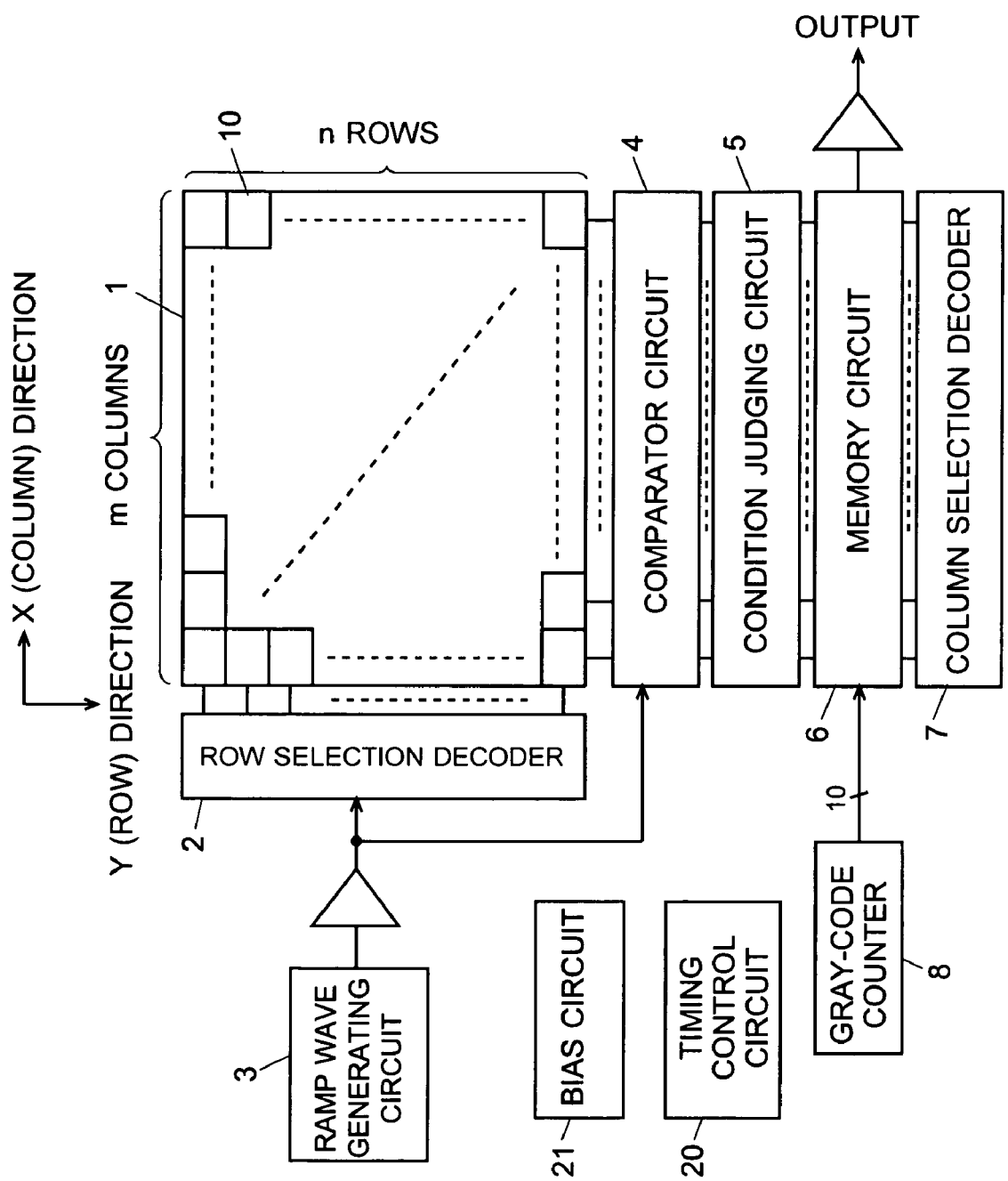
FIG. 1 is a block diagram illustrating an overall configuration of an image sensor according to an embodiment of the solid-state image sensor of the present invention.
Figure 2:
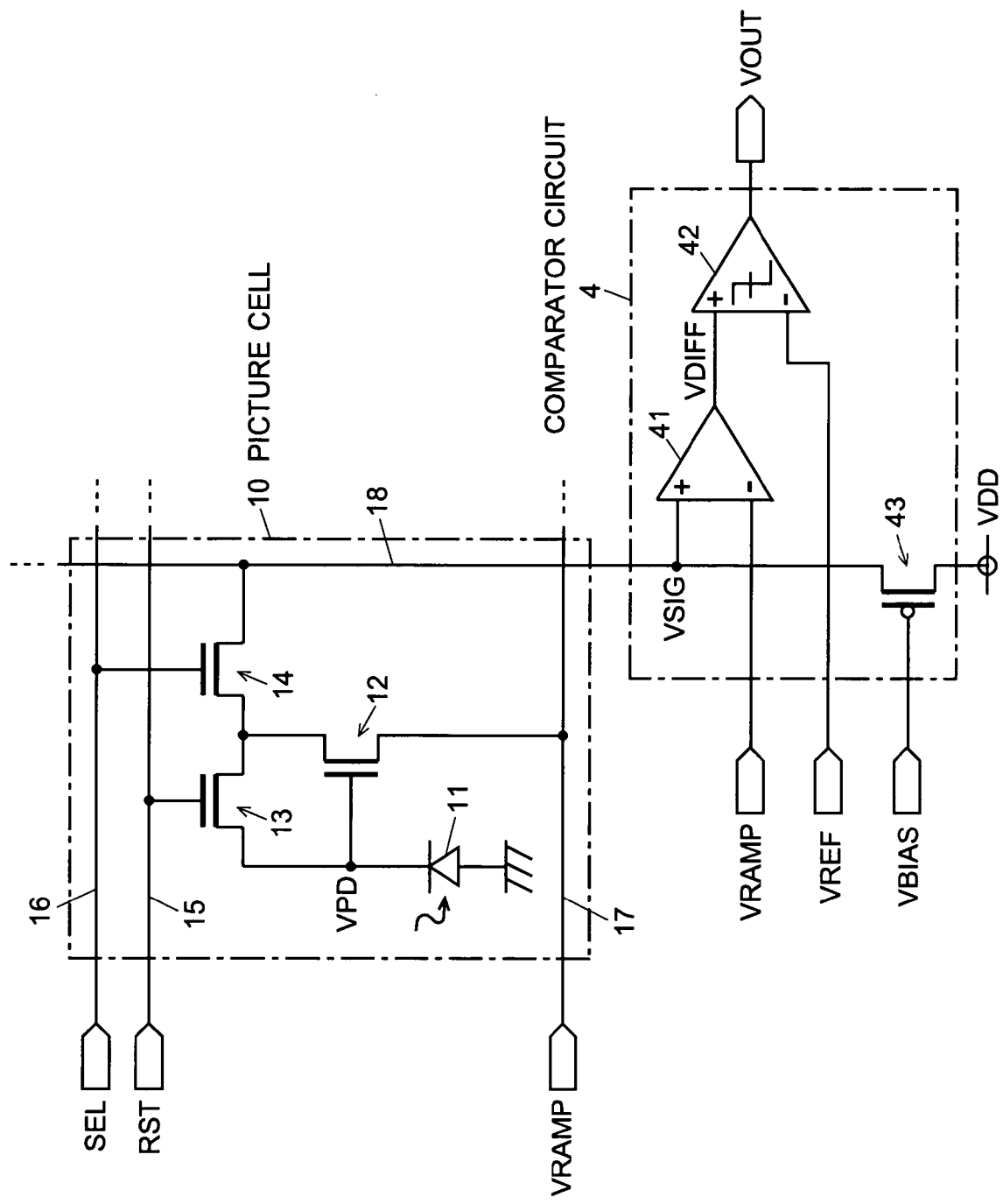
FIG. 2 is a circuit configuration diagram of one picture cell and one PWM converter in the image sensor of this (first) embodiment.
Figure 3:
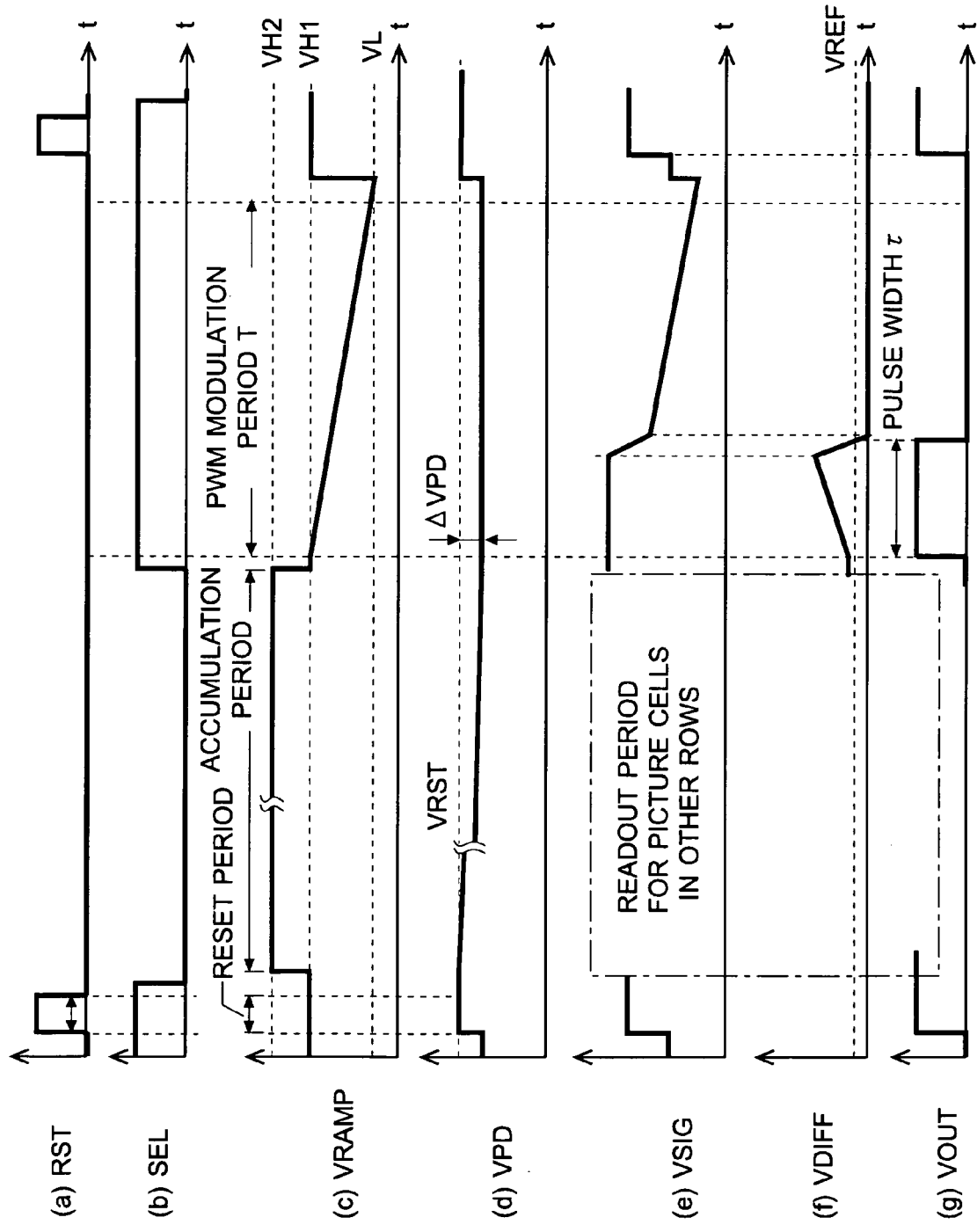
FIG. 3 is a timing chart for explaining a readout operation of the image sensor of the first embodiment.
Figure 4:
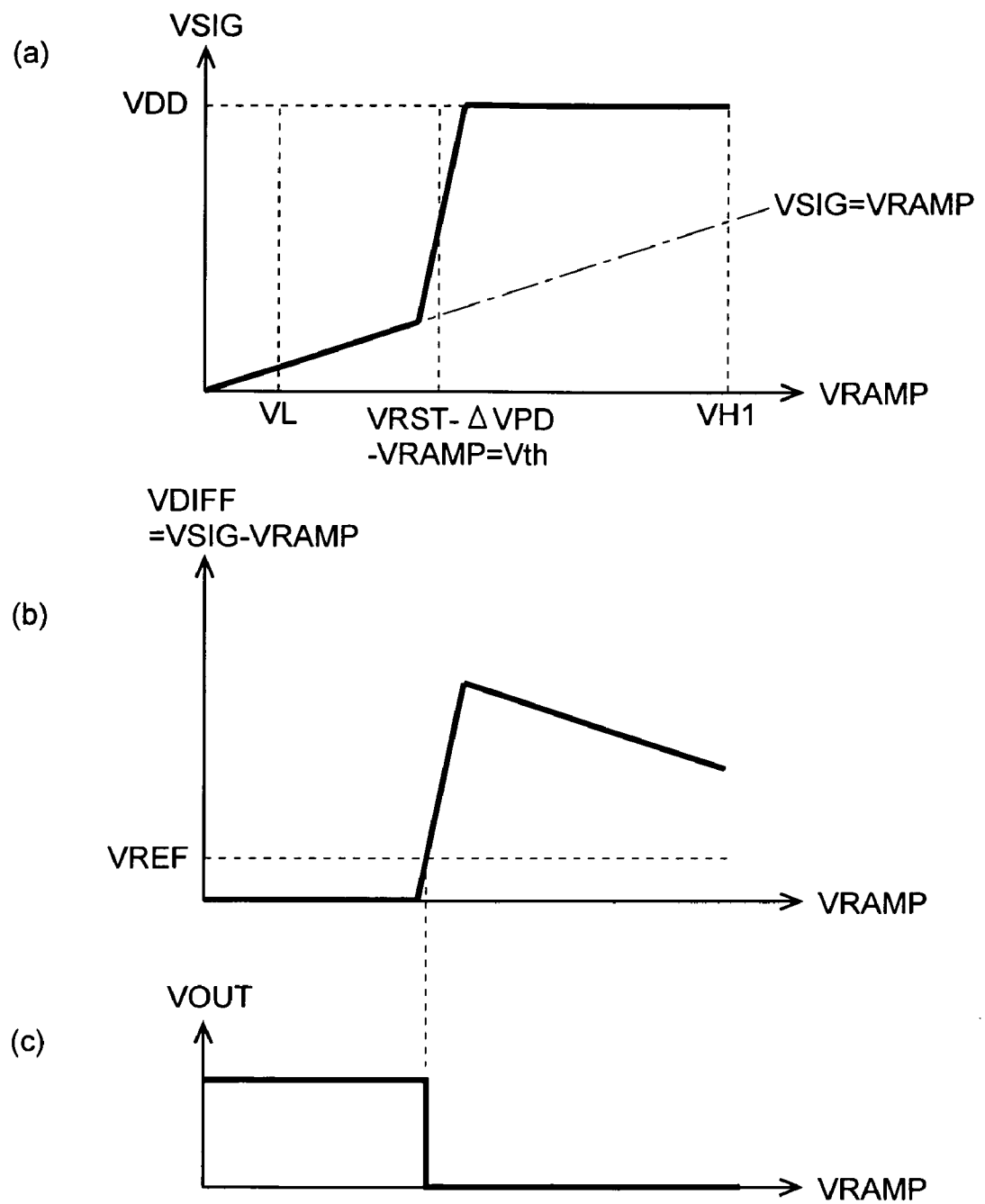
FIG. 4 is a diagram for explaining a PWM signal converting operation in the image sensor of the first embodiment.

Hereinafter, a CMOS image sensor which is an embodiment (first embodiment) of the solid-state image sensor according to the present invention is described with reference to the attached drawings. FIG. 1 is a block diagram illustrating an overall configuration of an image sensor according to this embodiment. FIG. 2 is a circuit configuration diagram of one picture cell and one PWM converter. FIG. 3 is a timing chart for explaining a picture signal readout operation of the image sensor of this embodiment. FIG. 4 is a diagram for explaining a PWM signal converting operation in the image sensor of this embodiment.

As illustrated in FIG. 1, the image sensor according to the present embodiment includes: an image cell unit 1 in which picture cells 10 are arranged in a two-dimensional matrix of n-rows and m-columns; a row selection decoder 2 for setting various control signals (which will be described later) to each row in the image cell unit 1; a ramp voltage generating circuit 3 for generating a ramp waveform voltage; a comparator circuit 4 placed corresponding to each column in the image cell unit 1; a condition judging circuit 5 for generating a pulse signal at a predetermined timing based on an output signal (PWM signal) by the comparator circuit 4 (specifically, in synchronization with a clock signal for activating an aforementioned Gray-code counter 8); a Gray-code counter 8 for counting up in synchronization with a predetermined clock signal; a memory circuit 6 including a temporary memory and buffer memory, for reading the count value of the Gray-code counter 8 according to the pulse signal by the condition judging circuit 5, latching the count value as output data, and sequentially providing the output data when all output data corresponding to m picture cells 10 aligned in rows are stored; a column selection decoder 7 for controlling such operations of the memory circuit 6 or other units; a timing control circuit 20 for providing predetermined control signals to each unit; and a bias circuit 21 for biasing an analog circuit. The row selection decoder 2 and the column selection decoder 7 may be a scanner; however, a decoder is more favorable taking the possibility of a random-access into account. The Gray-code counter 8 may be a Johnson counter or another type of counter; however, a Gray-code counter is more favorable in view of lowering the power consumption.

As illustrated in FIG. 2, one picture cell 10 includes one photodiode (a photoelectric converter in the present invention) 11 and three MOS transistors 12, 13, and 14. Therefore, it is a small circuit corresponding to a 3Tr configuration of the APS method. The anode terminal of the photodiode 11 is grounded. The second MOS transistor 13, which is a switch for resetting, and a gate terminal of the first MOS transistor 12, which functions as a common-source amplifier, are connected to the cathode terminal. The gate terminal of the second MOS transistor 13 is connected to the reset signal line 15, and the source terminal of the first MOS transistor 12 is connected to the ramp voltage signal line 17. Both drain terminals of the first and second MOS transistors 12, 13 are connected to the vertical signal line 18 via the third MOS transistor 14 which is a switch for output selection. The gate terminal of the third MOS transistor 14 is connected to the row selection signal line 16.

The reset signal line 15, row selection signal line 16, and ramp voltage signal line 17 are shared by m picture cells aligned in rows in the image cell unit 1. The vertical signal line 18 is shared by n picture cells aligned in columns in the image cell unit 1. The vertical signal line 18 is connected to a power supply line which provides a positive voltage VDD via the MOS transistor 43 which functions as a load current source. Of course, the MOS transistor 43 may be replaced by a load resistance using a polysilicon or the like, or may be a diode-connected transistor or the like.

The vertical signal line 18 is connected to one input terminal of the differential amplifier 41 which is included in the comparator circuit 4. The ramp voltage VRAMP which is similar to that supplied to the ramp voltage signal line 17 is provided to the other input terminal of the differential amplifier 41. The differential voltage VDIFF which is a difference between the voltages provided to the both input terminals is connected to one input terminal of the comparator 42, and to the other input terminal of the comparator 42, a reference voltage VREF is applied. Since the comparator 42 emits "H" when the differential voltage VDIFF is larger than the reference voltage VREF or "L" when the differential voltage VDIFF is smaller than the reference voltage VREF, the signal is binarized in this instance and becomes a PWM signal having information in the pulse width.

The operation of the circuit in FIG. 2 will be described later in detail; in short, the picture cell 10 and the comparator circuit 4 generate a PWM signal having a pulse width corresponding to the intensity of the light incident onto the photodiode 11, and provide it as an output voltage VOUT. The aforementioned condition judging circuit 5 has memories for every column for memorizing the value of the output voltage VOUT at an adjacent time (one pulse before of the aforementioned clock signal), and compares it with the output voltage VOUT at the present moment. Based on the comparison, the condition judging circuit 5 generates a pulse signal by detecting the changing point from "H" to "L" of the PWM signal, and initializes the memories to "H" right before the ramp waveform voltage begins to decrease. The Gray-code counter 8 resets the count value to the minimum value Dmin right before the ramp waveform voltage begins to decrease for example (this can be the same timing when the condition judging circuit 5 initializes the memories), and begins to count up the clock signal of a predetermined frequency. This clock signal has a frequency sufficiently higher than the pulse width of the PWM signal. In the memory circuit 6, the count value of the Gray-code counter 8 is latched in the memory according to the aforementioned pulse signal from the condition judging circuit 5. Therefore, the wider the pulse width of "H" level of the PWM signal is, i.e. the greater the amount of the incident light is, the longer the time period from the start of the counting up to the latching of the Gray-code counter 8 becomes, and the greater counter value is latched (as Gray code of course) in the memory. In this way, the information of the pulse width of the PWM signal is converted to a digital value.

Each memory of the memory circuit 6 is set to the maximum value Dmax at the beginning of the PWM conversion period, and when the pulse signal from the condition judging circuit 5 is obtained as a latch clock as described earlier, the maximum value Dmax stored in the beginning is rewritten with the count value of the Gray-code counter 8 at the moment. This prevents the output of the erroneous value according to an overflow or underflow in the case where the intensity of light received is too high or too low. That is, in the case where the light received is too weak to be detected by this image sensor, the minimum value Dmin is provided, and in the case where the light received is strong enough to be beyond the detectable range, the maximum value Dmax is provided.

Next, the PWM conversion operation, which is the greatest characteristic of the image sensor according to the present embodiment, will be described with reference to FIGS. 3 and 4. As illustrated in FIG. 3, an operation in one cycle includes a reset period, electric charge accumulation period, and PWM conversion period.

First, as illustrated in FIG. 3(*c*), the ramp voltage VRAMP which is supplied to the ramp voltage signal line 17 is set to a predetermined high voltage VH1 to set the potential of the source terminal of the first MOS transistor 12 to VH1. In this state, the reset signal RST which is supplied to the reset signal line 15 is set to "H" level and the second MOS transistor 13 is turned on to reset the potential of the cathode terminal of the photodiode 11 (photodiode potential VPD). At this point, the row selection signal SEL which is supplied to the row selection signal line 16 is set to "H". Since this turns on the third MOS transistor 14, the drain terminals of the first and second MOS transistors 12 and 13 are biased to the positive voltage VDD. Since the photodiode potential VPD at the resetting point is higher than the source potential of the first MOS transistor 12 roughly by the threshold voltage Vth, the reset potential VRST of the photodiode 11 will be VH1+Vth. Meanwhile, it is preferable to apply a sufficiently large voltage by bootstrapping or in other ways when the reset signal RST and the row selection signal SEL are set to "H" level.

After that, the row selection signal SEL is set from "H" to "L" to turn off the third MOS transistor 14, moving into the electric charge accumulation period. In the electric charge accumulation period, the photodiode potential VPD gradually starts to decline by the electric current which flows corresponding to the light intensity incident onto the photodiode 11. The higher the intensity of light received per unit time is, the steeper the declination of the photodiode potential VPD becomes. During the electric charge accumulation period, the ramp voltage VRAMP applied to the ramp voltage signal line 17 is maintained at VH2 which is higher than VH1. This makes the gate-source voltage negative, or even if it is positive, the potential difference will be small. Accordingly, the leakage current by the subthreshold leak will be small. As a result, the potential lowering factors other than the declination of the photodiode potential VPD by incident light are eliminated and the accuracy of signal conversion enhances.

During the period when the accumulation operation is carried out in the picture cell being focused on now, in the comparator circuit 4, the information of the photodiode potential obtained by a photoelectric conversion before then in the picture cells, which share the vertical signal line 18, in other rows is read out and PWM conversion is carried out.

As described earlier, the voltages of the reset signal RST and the row selection signal SEL are sufficiently large when the resetting operation is carried out. Therefore, under the premises that the source-drain voltages of the MOS transistors 13 and 14 are the same, if the photodiode potential VPD decreases by ΔVPD by the accumulation of the signal electric charge by the light received during the aforementioned charge accumulation period as illustrated in FIG. 3(*d*), the photodiode potential at the end of the charge accumulation period will be VRST−ΔVPD, i.e. VH1+Vth−ΔVPD. After the charge accumulation period is finished, the row selection signal SEL is set from "L" to "H" to provide electrical conduction between the drain terminal of the first MOS transistor 12 and the vertical signal line 18, activating the first MOS transistor 12. Then, the ramp voltage VRAMP supplied to the ramp voltage signal line 17 is brought back from VH2 to VH1, and from this potential as a starting point, the voltage is decreased to the voltage VL at a constant rate (voltage/time). That is, the ground potential of the first MOS transistor 12, which is a common-source amplifier, is gradually decreased in a ramp waveform.

Since the first MOS transistor 12 is in an off-state at the beginning of the voltage reduction, the output voltage VSIG of the picture cell 10 is almost constantly maintained at the positive voltage VDD. When the ramp voltage VRAMP decreases and the voltage difference between the potential of the gate terminal of the first MOS transistor 12, i.e. the photodiode potential VPD (=VRST−ΔVPD) and the potential of the source terminal of the first MOS transistor 12, i.e. the ramp voltage VRAMP, exceeds the threshold voltage Vth of the first MOS transistor 12, the first MOS transistor 12 is turned on and the electrical conduction between the source and drain is practically established. Then, the output voltage VSIG suddenly decreases from the previous voltage, VDD. Since the output voltage VSIG is nearly the potential of the ramp voltage VRAMP, the output voltage VSIG decreases as the ramp voltage VRAMP decreases. This remains until the ramp voltage VRAMP decreases to VL.

FIG. 4(*a*) is a diagram illustrating a relationship between the ramp voltage VRAMP and the output voltage VSIG. As stated earlier, as the ramp voltage VRAMP is decreased from VH1 to VL, the output voltage VSIG changes in such a way that it follows the polygonal line shown in FIG. 4(*a*) from right to left. As obviously illustrated in this figure, the output voltage VSIG suddenly changes around a point where VRST−ΔVPD−VRAMP equals the threshold voltage Vth. Therefore, the greater ΔVPD is, the longer the time period from the starting point of the voltage reduction of the ramp voltage VRAM to the sudden change of the output voltage VSIG becomes.

In the comparator circuit 4, the aforementioned output voltage VSIG is applied to one input terminal of the differential amplifier 41 via the vertical signal line 18, and the ramp voltage VRAMP is applied to another input terminal. Within the picture cell 10, the source potential of the first MOS transistor 12 is in a similar state as modulated by the ramp voltage RAMP, therefore, the output voltage VSIG is equivalent to the voltage biased (or offset) by this ramp voltage VRAMP. By deducting this bias by the differential amplifier 41, the influence of the ramp voltage VRAMP is eliminated from the differential voltage VDIFF, which is the output of the differential amplifier 41, as illustrated in FIG. 4(*b*). That is, the differential voltage VDIFF changes as illustrated in FIG. 3(*f*). In the comparator 42, the differential voltage VDIFF is compared with the reference voltage VREF. While the differential voltage VDIFF is below the reference voltage VREF, "H" is provided, and while the differential voltage VDIFF is above the reference voltage VREF, "L" is provided. And the pulse signal as illustrated in FIG. 3(*g*) is hence provided as the output voltage VOUT.

As described earlier, the greater ΔVPD which corresponds to the integrated value of the intensity of light received is, the longer the time period from the starting point of the voltage reduction to the sudden change of the output voltage VSIG becomes. Accordingly, the pulse width of the output voltage VOUT gets wider. In this way, ΔVPD is converted to the PWM signal.

The aforementioned PWM conversion operation can be expressed in equations as follows. Let the starting time of the PWM conversion be 0, and let the time elapsed from it be t. The waveform of the ramp voltage is expressed by the following equation. Note that T is the time period required for the ramp voltage to change from VH1 to VL.

$$VRAMP=-\{(VH1-VL)/T\}t+VH1 \tag{1}$$

ΔVPD can be expressed by the following equation (2) since it is proportional to the photocurrent Iph.

$$\Delta VPD=\alpha Iph \tag{2}$$

Based on the equations (1) and (2), the following equation (3) is obtained.

$$VRST-\alpha Iph+\{(VH1-VL)/T\}t-VH1=Vth \tag{3}$$

On the other hand, VRST has the approximate relationship expressed by the following equation (4).

$$VRST=VH1+Vth \tag{4}$$

Hence, the equations (3) and (4) gives the following equation (5).

$$\tau=\alpha\{T/(VH1-VL)\}Iph \tag{5}$$

This shows that τ and Iph have a proportional relation, and the amount of photocurrent is converted to the pulse width τ.

In the first embodiment which was described earlier, the source-grounded amplifier placed within the picture cell 10 is simple in structure and has an advantage in the size reduction of a picture cell. At the same time, it has a disadvantage in lowering power consumption because the electric current constantly flows while the first MOS transistor 12 is in an on-state.

Second Embodiment

Figure 5:
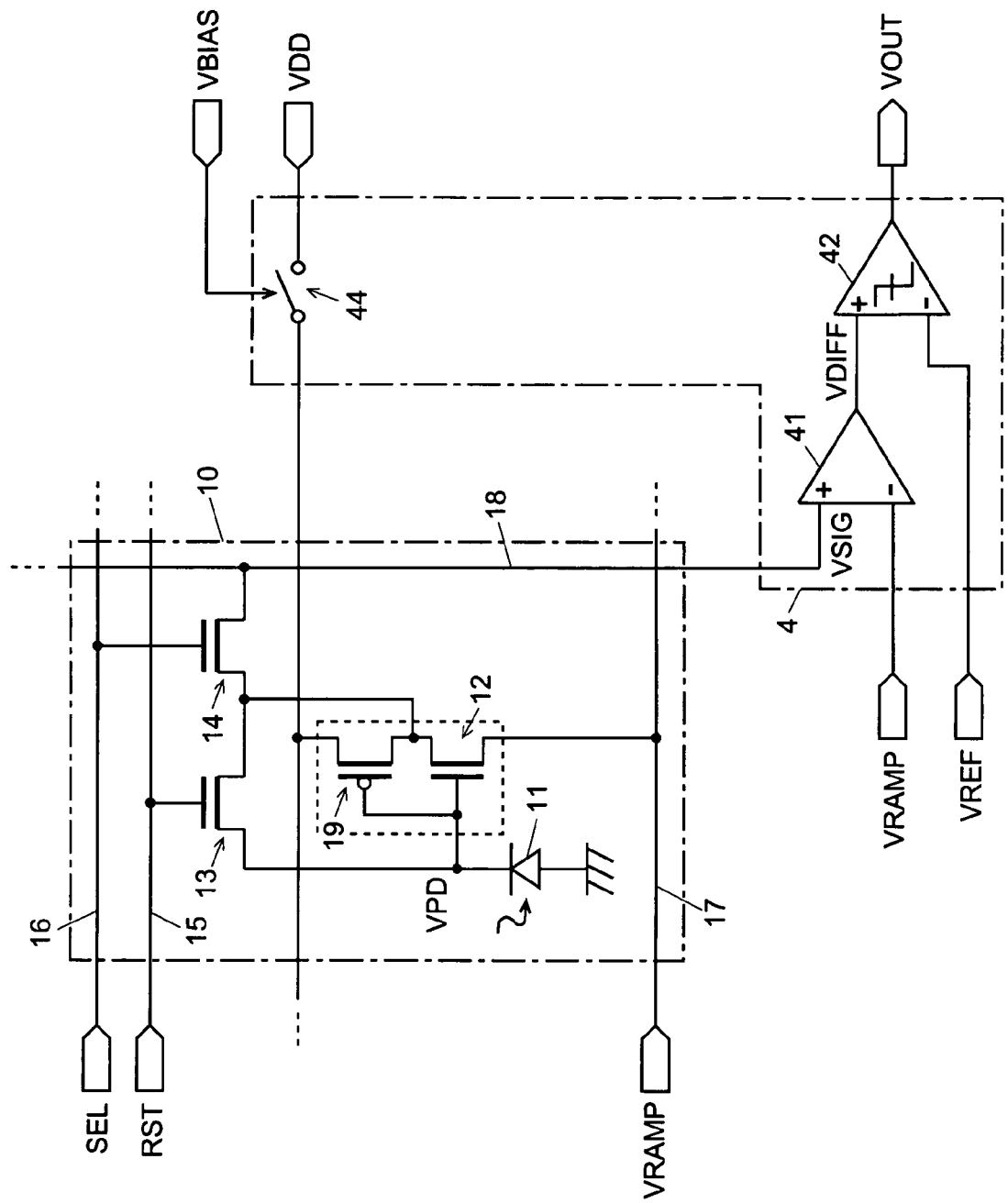
FIG. 5 is a diagram illustrating a circuit configuration of one picture cell in the image sensor of the second embodiment.

Given this, in the image sensor according to the second embodiment, the circuit configuration of one picture cell 10 explained in FIG. 2 is transformed to that illustrated in FIG. 5. More specifically, another transistor, the forth MOS transistor 19, is added to the source-grounded first MOS transistor 12, and a CMOS inverter is made up by the first and fourth MOS transistors 12 and 19. In this configuration, the size of a picture cell corresponds to that of a 4Tr-type of an APS method since the number of transistors in the picture cell 10 increases from three to four. However, since the two MOS transistors 12 and 19 are turned on in a complementary manner, an electric current does not flow even during the PWM conversion period as described earlier for example, except in the transit state when the output level changes. In this regard, this configuration has an advantage in lowering power consumption.

Third Embodiment

Figure 6:
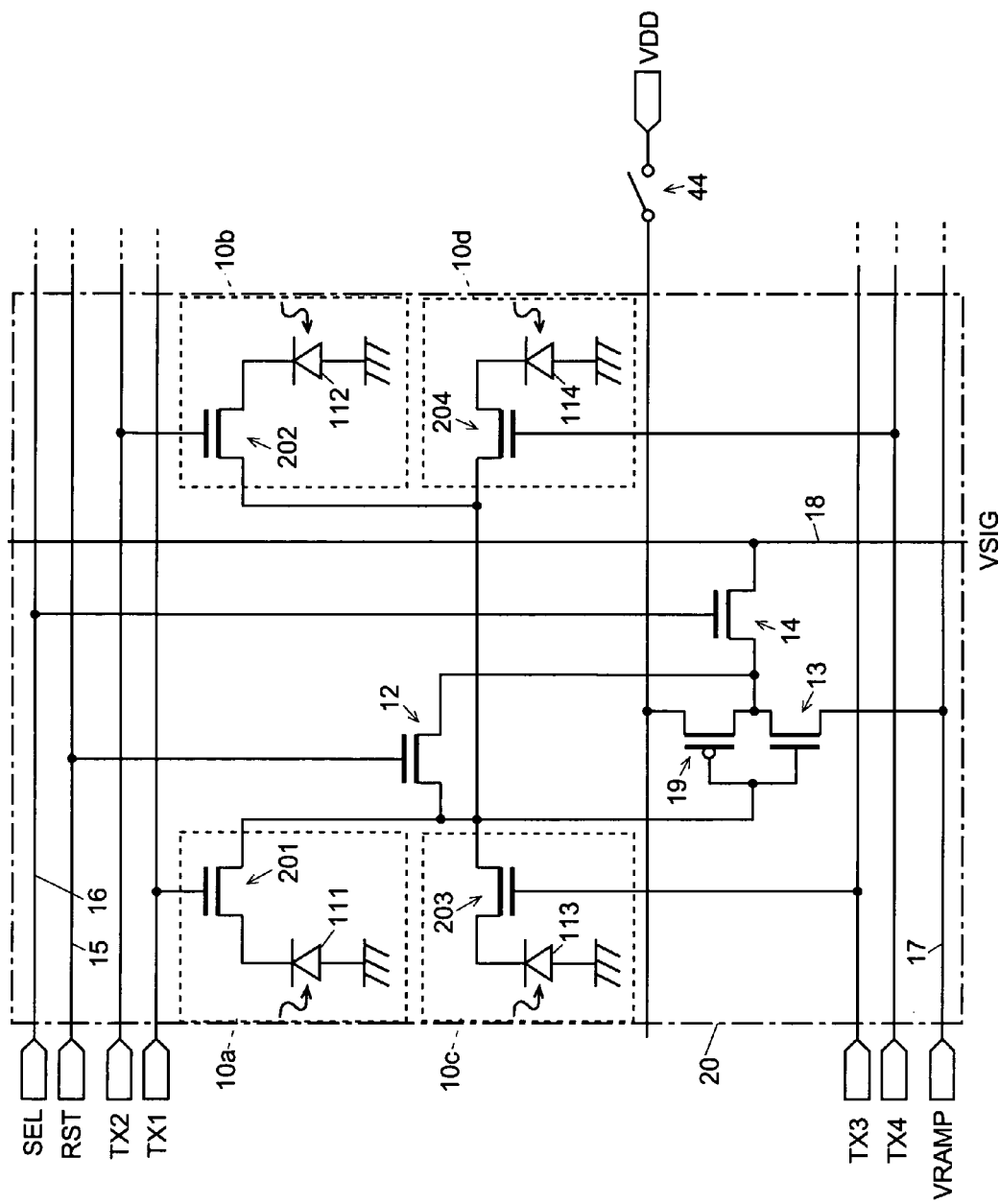
FIG. 6 is a diagram illustrating an example of a circuit configuration of the image sensor in which plural picture cells are shared of the third embodiment.

In the aforementioned first and second embodiments, three or four MOS transistors 12, 13, 14 and 19 other than the photodiode 11 are placed in one picture cell 10. However, these MOS transistors may be shared by plural photodiodes. FIG. 6 is a diagram illustrating the configuration of a picture cell of the image sensor according to the third embodiment. This is an example of a circuit in which four MOS transistors 12, 13, 14 and 19 are shared by the four photodiodes 111, 112, 113 and 114 which individually perform photoelectric conversion of the incident light. In order to realize the share, each of the source terminals of the MOS transistors 201, 202, 203 and 204 for selecting a PD is connected to each of the cathode terminals of the photodiodes 111, 112, 113 and 114. All of the drain terminals of the four MOS transistors 201, 202, 203 and 204 are connected, and they are connected to the gate terminal of the first MOS transistor 12 and the source terminal of the second MOS transistor 13.

That is, in FIG. 6, each of the four picture cells 10a, 10b, 10c and 10d incorporates only a photodiode and a MOS transistor for selecting a PD, and one pixel unit 20 includes four picture cells 10a, 10b, 10c and 10d, and four MOS transistors 12, 13, 14 and 19. Therefore, the vertical signal line 18 is shared by plural pixel units 20 aligned in columns. The reset signal line 15, row selection signal line 16, and the ramp voltage signal line 17 are shared by plural pixel units aligned in rows. In addition, four picture cell selection signal lines TX1, TX2, TX3 and TX4 are added for selecting the four picture cells 10a, 10b, 10c and 10d. Also in this configuration, the basic signal readout operation (PWM conversion operation) is the same as that of the aforementioned first embodiment.

In this configuration, the number of MOS transistors used can be reduced by half compared to the aforementioned embodiments, in which four MOS transistors are used in one picture cell, (sixteen to eight for four picture cells). Therefore, the size of a picture cell can be reduced and this is effective in increasing the number of picture cells.

The first embodiment illustrated in FIG. 2 is a configuration in which the first MOS transistor 12 is an N-type MOS transistor; however, using a P-type MOS transistor as the first MOS transistor 12 for a similar configuration will readily occur to those skilled in the art of the invention. Of course, it goes without saying that the polar character (or magnitude relation) of voltage, the polar character of a gradient of ramp voltage, and the like are reversed to those of an N-type MOS transistor. However, since in both the N-type and P-type, the polar character of a gradient of the ramp voltage can also be changed according to the counting up/down of a Gray-code counter, the relationships in the embodiments described earlier are merely examples, and it will be easily reached that various combinations can be used. In addition, it will also be easily reached that a depletion-type transistor, enhancement-type transistor, or the like can be used as a MOS transistor.

Fourth Embodiment

Figure 7:
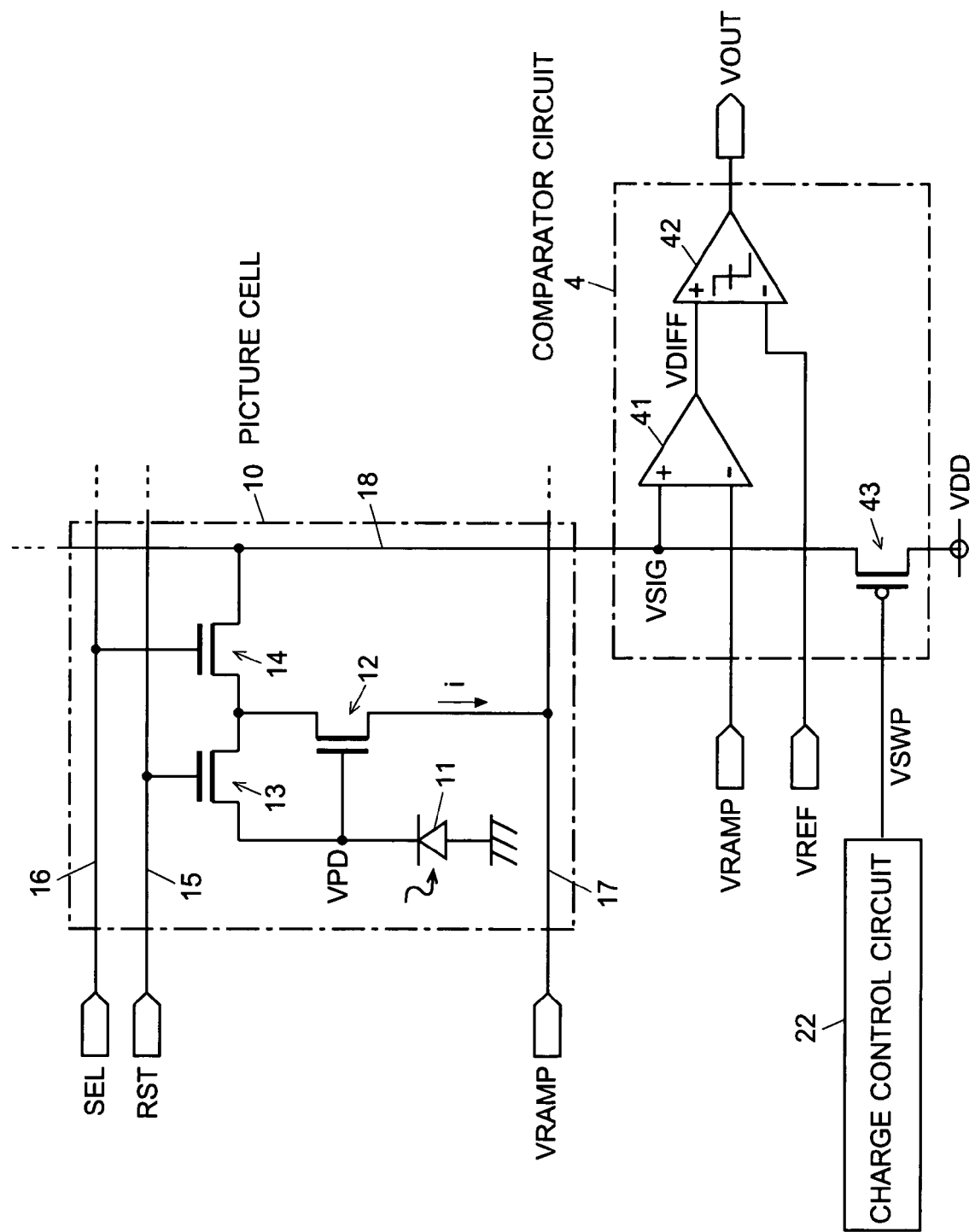
FIG. 7 is a circuit configuration diagram of one picture cell and one PWM converter in the image sensor of the fourth embodiment.

Next, the configuration and operation of the image sensor according to the fourth embodiment of the present invention is described. FIG. 7 is a circuit configuration diagram of one picture cell and one PWM converter in the image sensor of the fourth embodiment. FIG. 8 is a timing chart for explaining a PWM signal converting operation in this image sensor. FIG. 9 is a diagram for explaining the signal readout principle in this image sensor. In the image sensor of the fourth embodiment, the circuit configuration in one picture cell 10 and the configuration of one comparator circuit 4 for PWM conversion are exactly the same in the first embodiment, and therefore they are indicated with the same numeral. The difference in configuration is that a predetermined magnitude of bias voltage VBIAS is not applied to the gate terminal of the MOS transistor 43, which functions as a load constant current source, connected to the vertical signal line 18, but a control voltage VSWP for switching on/off the MOS transistor 43 from a charge controller 22 is applied to the gate terminal of the MOS transistor 43.

If the first MOS transistor 12 which is an amplifier in the picture cell 10 and the MOS transistor 43 which is a load in the configuration of FIG. 2 illustrating the image sensor according to the first embodiment are equivalently illustrated, they will be as shown in FIG. 9(a). That is, a constant current source is connected between the drain terminal of the source-grounded MOS transistor 12 and a power supply line. Therefore, in the state where the input voltage Vin is larger than the threshold voltage Vth of the MOS transistor 12 and the MOS transistor 12 is on, an electric current Ib constantly flows to the MOS transistor 12. Hence, the power consumption in the MOS transistor 12 is the product of the supply voltage VDD and the constant electric current Ib. If this is explained on the timing chart of FIG. 3, the constant electric current flows through the MOS transistor 12 after VSIG significantly decreases during the PWM modulation period T (when the gate-source voltage of the MOS transistor 12 exceeds the threshold voltage Vth). This constant electric current is a wasted electric current because it does not have any information on a photodiode potential.

On the other hand, in the image sensor according to the present embodiment, the MOS transistor 43 is not used as a load constant current source, but as a control switch for supplying a charging current for charging a stray capacitance connected to the vertical signal line 18. That is, in the equivalent circuit of FIG. 9(b), the MOS transistor 43 in FIG. 7 corresponds to the switch SW1, the MOS transistor 12 corresponds to the switch SW2, and the stray capacitance corresponds to CL. By controlling the on/off switches SW1 and SW2, the output according to the photodiode potential is obtained.

Specific operation is described with reference to FIG. 8. After the electric charge by photoelectric conversion is accumulated on the photodiode 11 in a picture cell 10 which is to be read out and moving into the PWM modulation period, the charge control voltage VSWP is set to "L" for a predetermined time before the row selection signal SEL is set from "L" to "H" (see FIG. 8(c)). When the charge control voltage VSWP is "L", the MOS transistor 43 is on, the potential of the vertical signal line 18 is raised nearly to the supply voltage VDD. The stray capacitance CL placed between the vertical signal line 18 and the ground is charged, and the charged electric charge is held even after the charge control voltage VSWP is set to "H" to turn off the MOS transistor 43. After that, the third MOS transistor 14 is turned on when the row selection signal SEL changes from "L" to "H". At this point in time, both the first and second MOS transistors 12 and 13 are off, and the input impedance of the differential amplifier 41 is high; therefore, the potential of the vertical signal line 18, VSIG, is maintained around the supply voltage VDD except that the voltage gradually decreases due to a leakage current.

After that, the ramp voltage VRAMP applied to the source terminal of the first MOS transistor 12 is decreased at a predetermined rate, and when the source-gate voltage of the first MOS transistor 12 exceeds the threshold voltage Vth, the first MOS transistor 12 is turned on. And then, the discharge of the charged electric current held in the stray capacitance CL of the vertical signal line 18 makes an electric current i flow through the third MOS transistor 14 and the first MOS transistor 12, and the potential of the vertical signal line 18 VSIG decreases to the source potential of the first MOS transistor 12. After that, the potential VSIG decreases as the ramp voltage VRAMP decreases (see FIG. 8(d)). Therefore, the changing process of the output voltage VSIG is almost the same as that of the first embodiment. Also, the voltage VOUT taken via the comparator circuit 4 is almost the same.

On the other hand, as for electric currents, a transitional discharged electric current flows when the first MOS transistor 12 is turned on from an off-state (when the switch SW2 is turned on in FIG. 9(b)), as shown in FIG. 8(e). After that, an electric current flows little by little as the source potential of the first MOS transistor 12 decreases. In any case, the electric currents which flow in total are only the electric current charged at the beginning (i.e. when the charge control voltage VSWP is set to "L"). Therefore, there is no bias current which constantly flows from the load constant current source after the significant change of the output voltage VSIG. Hence, the power consumption can be considerably decreased compared to the configuration of the first embodiment.

Fifth Embodiment

Figure 10:
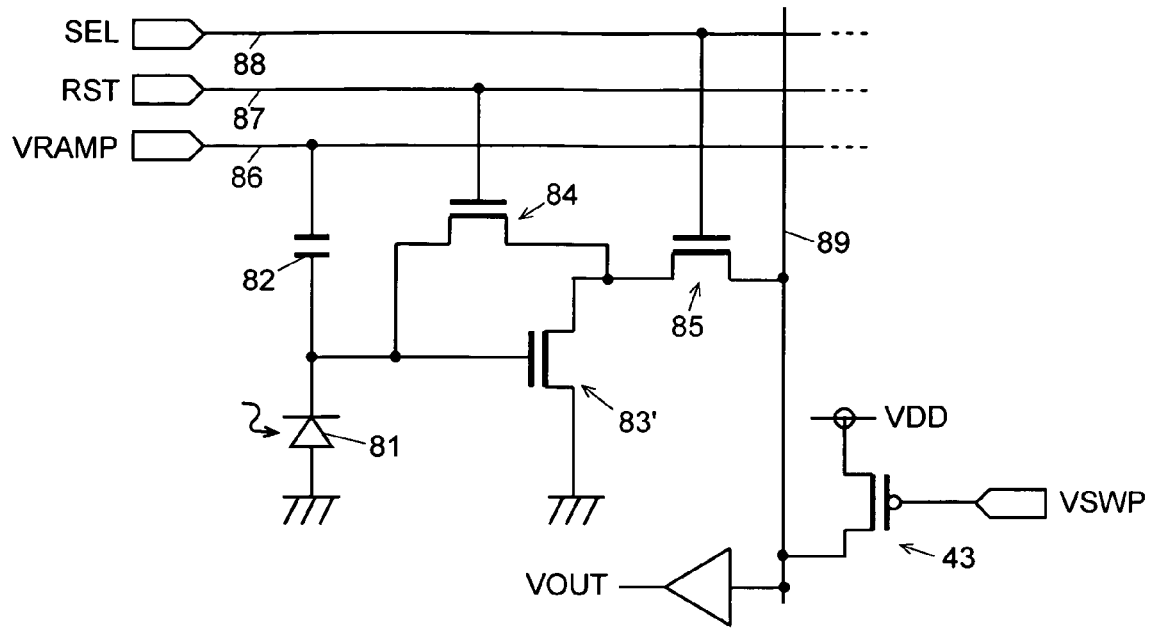
FIG. 10 is a circuit configuration diagram of a main portion of one picture cell and a PWM converter in the image sensor of the fifth embodiment.
Figure 11:
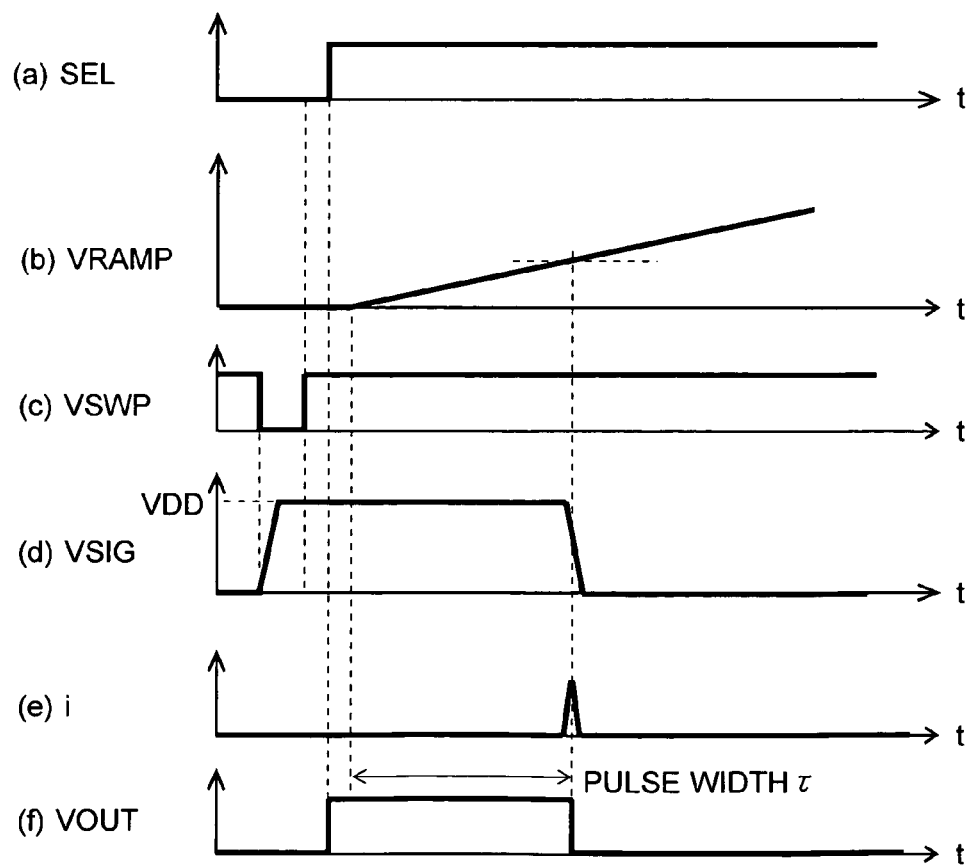
FIG. 11 is a timing chart for explaining a PWM signal converting operation in the image sensor of the fifth embodiment.
Figure 12:
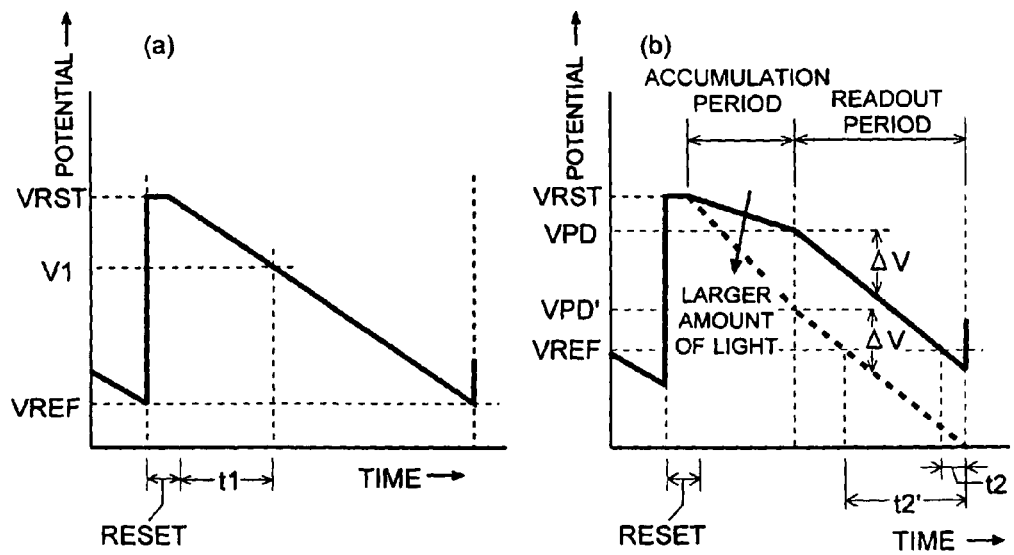
FIG. 12 is a diagram for explaining the difference among several signal readout methods in a common image sensor.
Figure 13:
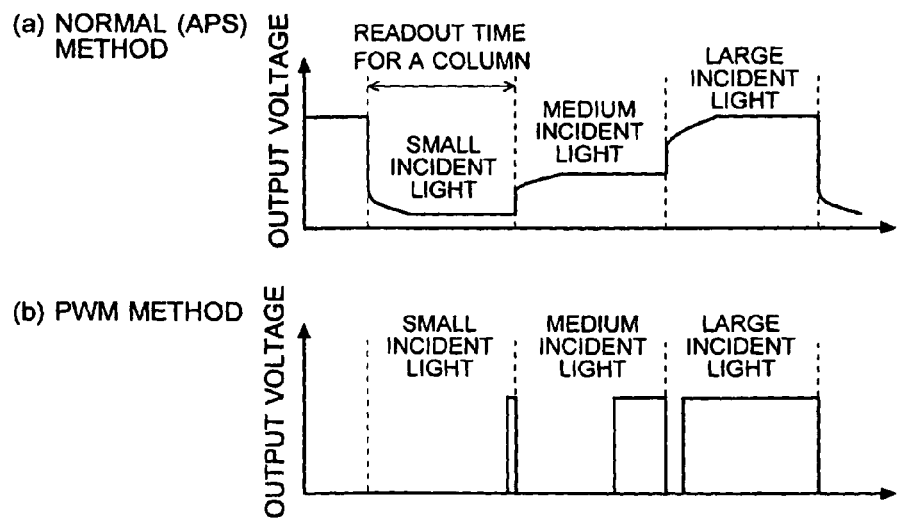
FIG. 13 is a diagram for explaining the difference between several signal readout methods in a common image sensor.
Figure 14:
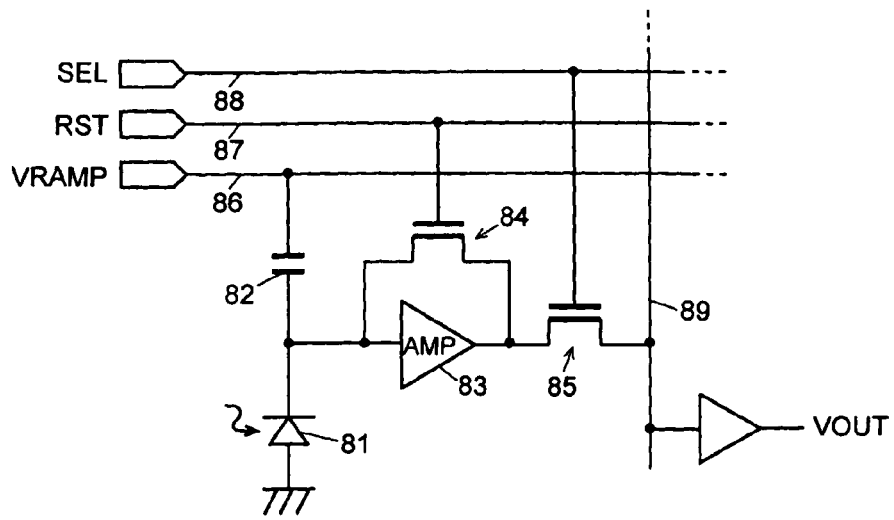
FIG. 14 is a diagram illustrating a circuit diagram of a picture cell in a conventional low-voltage PWM image sensor.

The signal readout method explained in the fourth embodiment which was described earlier can also be applied to the low-voltage PWM image sensor illustrated in FIG. 14 which was explained as a conventional art. This configuration is explained as the fifth embodiment. FIG. 10 illustrates a configuration of the picture cell illustrated in FIG. 14 in which a source-grounded MOS transistor 83' is used for the amplifier 83, and the MOS transistor 43 for stray capacitance charge control is added to the vertical signal line 89. FIG. 11 is a timing chart for explaining a PWM signal converting operation of this circuit.

Figure 15:
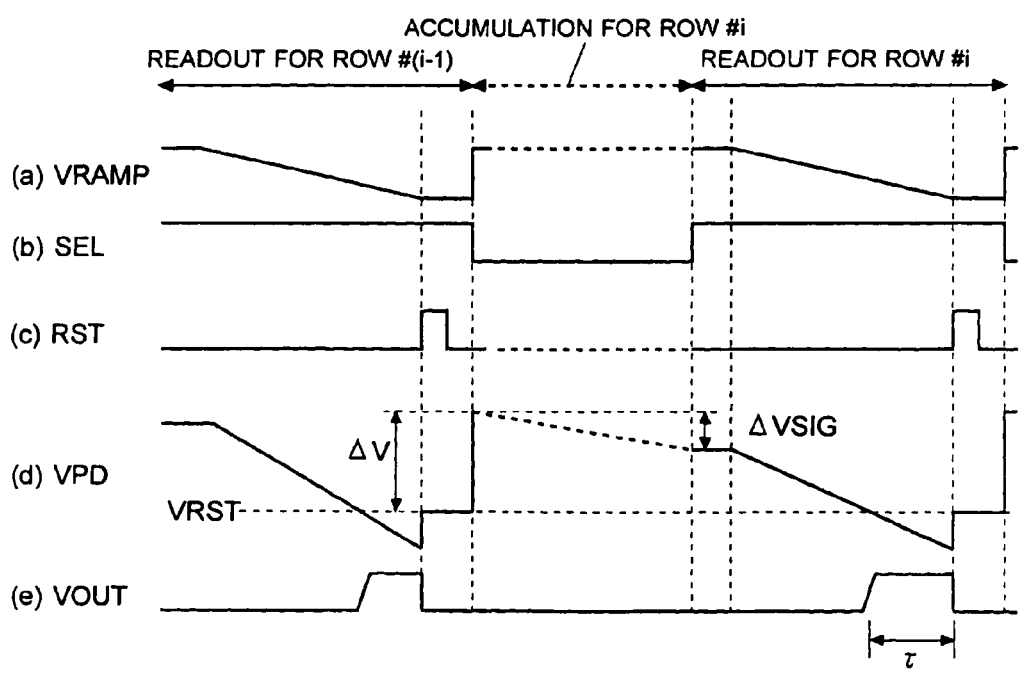
FIG. 15 is a timing chart for explaining a signal readout operation of a conventional low-voltage PWM image sensor.

In the timing chart illustrated in FIG. 15, the ramp voltage VRAMP is decreased at a predetermined rate; however, in this configuration, the ramp voltage is increased at a predetermined rate in reverse (see FIG. 11(b)). This is because the MOS transistor 83 is required to be in an off-state at the beginning of the PWM conversion. Anything other than that condition is basically the same as in the readout method which was described earlier.

That is, the charge control voltage VSWP is set to "L" for a predetermined period of time before the row selection signal SEL is set from "L" to "H" (see FIG. 11(c)). This turns on the MOS transistor 43 and the potential of the vertical signal line 89 is raised around the supply voltage VDD, and the stray capacitance CL existing between the vertical signal line 89 and the ground is charged. After that, the row selection signal SEL is changed from "L" to "H", and the ramp voltage VRAMP applied to one terminal of the capacitor 82 is increased at a constant rate. The photodiode potential VPD is also increased. When the photodiode potential VPD exceeds the threshold voltage Vth of the MOS transistor 83', the MOS transistor 83' is turned on, and the current i flows through the MOS transistors 85 and 83' by the discharge of the electric charge held in the stray capacitance CL of the vertical signal line 18. Then the potential VSIG of the vertical signal line 89 is decreased to the ground potential (see FIG. 11(d)). As for electric currents, even in this case, only a transitional discharged electric current flows when the first MOS transistor 83' is turned on from an off-state, as shown in FIG. 11(e), and there is no electric current which constantly flows from a load constant current source after the significant change of the output voltage.

In the fourth and fifth embodiments which were described earlier, an amplifier in a picture cell is the source-grounded MOS transistor 12 (83'). However, as described in the second embodiment, if a CMOS amplifier is used as an amplifier, the electric current which constantly flows can be reduced to almost zero. At the same time, even in this case, an instantaneous through current flows from the power supply line to the ground when the CMOS inverter amplifier changes from an on-state to an off-state or the other way around. The power consumption then depends on the time period while the gate-source voltage is around the threshold voltage Vth. Therefore, in the case where the slew rate of the ramp voltage is low (where the slope is gentle) or in the case where the width of the transition range of the CMOS inverter amplifier is wide, the time period in which the through current flows accordingly gets longer, and the power consumption is increased by just that much. On the other hand, according to the signal readout method as described earlier, an electric current flows only for the charge charged in a stray capacitance regardless of the property of the CMOS amplifier or the slew rate of the ramp voltage. This is the advantage of easy control of power consumption. In addition, although the charge control circuit 22 is required to generate the charge control voltage VSWP, the size of this circuit is considerably small compared to adding one MOS transistor to every picture cell to make the amplifier a CMOS amplifier. Therefore, this has the advantage of downsizing a picture cell and increasing the density of picture cells.

Each of the embodiments described earlier was merely an example of the present invention. It is apparent that modifications, corrections, and additions within the scope of the present invention other than various modifications described earlier are included in the claims of the present invention.

The invention claimed is:

1. A solid-state image sensor comprising:
a photoelectric converter for generating a signal electric charge and for holding a potential of the signal electric charge,
wherein the signal electric charge corresponds to an intensity of incident light;
an amplifier unit including:
a first MOS transistor having a gate terminal configured to read out a held potential by the photoelectric converter, a drain terminal serving as an output terminal, and a source terminal;
a voltage applier for applying a ramp waveform voltage to the source terminal of the first MOS transistor; and
a signal converter for generating a binary signal having a pulse width corresponding to the held potential based on an output of the first MOS transistor when the ramp waveform voltage is applied to the source terminal of the first MOS transistor by the voltage applier while a potential to be read out is held in the photoelectric converter.

2. The solid-state image sensor according to claim 1, wherein the amplifier unit is an amplifier in which the first MOS transistor is an N-type or P-type transistor with its source grounded.

3. The solid-state image sensor according to claim 1, wherein the amplifier unit is a CMOS inverter amplifier in which a reverse polarity MOS transistor is further added to a side of the drain terminal of the first MOS transistor which is an N-type or P-type transistor.

4. The solid-state image sensor according to claim 1, further comprising:
a plurality of picture cells arranged in a two-dimensional matrix of n-rows and m-columns,
wherein each of the plurality of picture cells includes the photoelectric converter and the amplifier unit, and
each of the plurality of picture cells further includes at least a second MOS transistor for resetting the held potential of the photoelectric converter and a third CMOS transistor for an output selection to decide whether an output voltage of the first MOS transistor is provided to a signal line shared by the plurality of picture cells.

5. The solid-state image sensor according to claim 4, wherein the signal line is shared by all of the plurality of picture cells belonging to one column, and the signal converter is placed in every column.

6. The solid-state image sensor according to claim 1, further comprising:
a plurality of picture cells arranged in a two-dimensional matrix of n-rows and m-columns,
wherein each of the plurality of picture cells includes the photoelectric converter and an output gate circuit for selectively providing the held potential of the photoelectric converter; and each of a plurality of adjoining or adjacent picture cells shares the amplifier unit, a second MOS transistor for resetting the held potential of the photoelectric converters within the plural picture cells, and a third MOS transistor for an output selection to decide whether an output voltage of the first MOS transistor is provided to a signal line shared by the plurality of picture cells.

7. The solid-state image sensor according to claim 1, wherein the signal converter includes:
a waveform shaper for generating a voltage signal obtained by subtracting a voltage corresponding to the ramp waveform voltage from the output voltage of the first MOS transistor; and
a comparison element for binarizing an output voltage of the waveform shaper by performing a determination based on a predetermined judgment threshold.

8. The solid-state image sensor according to claim 1, wherein:
the first MOS transistor is an N-type transistor; and
upon resetting the held potential of the photoelectric converter, the voltage applier applies a first voltage, which is not a lowest potential of this element, to the source terminal of the first MOS transistor to initialize a potential of the photoelectric converter to a reset potential that is approximately a potential higher than the first voltage by a threshold voltage of the MOS transistor or approximately the threshold voltage, and the voltage applier applies a declivous ramp waveform voltage.

9. The solid-state image sensor according to claim 8, wherein the voltage applier applies a second voltage that is higher than the first voltage to the source terminal of the first MOS transistor when the held potential is decreased from the reset potential by generating a signal electric charge corresponding to an intensity of incident light after the held potential during an accumulation period of the photoelectric converter is set to the reset potential.

10. The solid-state image sensor according to claim 1, wherein:
the first MOS transistor is a P-type transistor; and
upon resetting the held potential of the photoelectric converter, the voltage applier applies a first voltage, which is not a highest potential of this element, to the source terminal of the first MOS transistor to initialize a potential of the photoelectric converter to a reset potential that is approximately a potential lower than the first voltage by an absolute value of a threshold voltage of the MOS transistor or approximately the threshold voltage, and the voltage applier applies an acclivitous ramp waveform voltage.

11. The solid-state image sensor according to claim 10, wherein the voltage applier applies a second voltage that is lower than the first voltage to the source terminal of the first MOS transistor when the held potential is increased from the reset potential by generating a signal electric charge corresponding to an intensity of incident light after the held potential during an accumulation period of the photoelectric converter is set to the reset potential.

12. The solid-state image sensor according to claim 1, wherein at least a MOS transistor included in the amplifier unit is placed on an SOI (Silicon on Insulator) substrate.

13. The solid-state image sensor according to claim 4, wherein:
the signal converter includes a fourth MOS transistor connected between the signal line and a power supply line;
the solid-state image sensor further includes a charge controller, which is a circuit for applying a control voltage to a gate terminal of the fourth MOS transistor, the charge controller charging a stray capacitance whose one end is connected to the signal line by providing electrical conduction of the fourth MOS transistor before the ramp waveform voltage is applied; and
the solid-state image sensor discharges a charged electric charge of the stray capacitance via the first MOS transistor when the ramp waveform voltage is applied to the source terminal of the first MOS transistor to change the output voltage of the first MOS transistor.

14. The solid-state image sensor according to claim 6, wherein:
the signal converter includes a fourth MOS transistor connected between the signal line and a power supply line;
the solid-state image sensor further includes a charge controller, which is a circuit for applying a control voltage to a gate terminal of the fourth MOS transistor, the charge controller charging a stray capacitance whose one end is connected to the signal line by providing electrical conduction of the fourth MOS transistor before the ramp waveform voltage is applied; and
the solid-state image sensor discharges a charged electric charge of the stray capacitance via the first MOS transistor when the ramp waveform voltage is applied to the source terminal of the first MOS transistor to change the output voltage of the first MOS transistor.

15. A signal readout method of a solid-state image sensor comprising:
generating a signal electric charge using a photoelectric converter,
wherein the signal electric charge corresponds to an intensity of incident light;
holding a potential of the signal electric charge using the photoelectric converter;
providing an amplifier unit including a first MOS transistor, the first MOS transistor having a gate terminal configured to read out a held potential by the photoelectric converter, a drain terminal that serves as an output terminal, and a source terminal;
generating a binary signal using a signal converter,
wherein the binary signal corresponds to the intensity of incident light based on an output of the first MOS transistor; and
applying a ramp waveform voltage to the source terminal of the first MOS transistor, while the held potential, which is to be read out, corresponding to the intensity of incident light, is held in the photoelectric converter,
wherein the ramp waveform voltage is applied using a voltage applier,
the binary signal has a pulse width that corresponds to the held potential, and is generated by the signal converter based on a change of the output of the first MOS transistor accompanying a change of the ramp waveform voltage.

16. The signal readout method of a solid-state image sensor according to claim 15, wherein the first MOS transistor is an N-type transistor, and upon resetting the held potential of the photoelectric converter, a potential of the photoelectric converter is initialized to a reset potential, which is approximately a potential higher than a first voltage, which is not a lowest potential of this element, by a threshold voltage of the MOS transistor or approximately the threshold voltage by applying the first voltage to the source terminal of the first MOS transistor, and then a declivous ramp waveform voltage is applied.

17. The signal readout method of a solid-state image sensor according to claim 15, wherein:
- the solid-state image sensor includes picture cells arranged in a two-dimensional matrix of n-rows and m-columns;
- each picture cell includes the photoelectric converter and the amplifier unit;
- each picture cell further includes at least a second MOS transistor for resetting the held potential of the photoelectric converter, and a third CMOS transistor for an output selection to decide whether an output voltage of the first MOS transistor is provided to a signal line shared by plural picture cells;
- the signal converter includes a fourth MOS transistor connected between the signal line and a power supply line;
- a stray capacitance has one end connected to the signal line, and is charged by applying a predetermined voltage to a gate terminal of the fourth MOS transistor to provide electrical conduction of the fourth MOS transistor before the ramp waveform voltage is applied; and
- the output voltage of the first MOS transistor is changed by discharging a charged electric charge of the stray capacitance via the first MOS transistor when the ramp waveform voltage is applied.

18. A solid-state image sensor comprising:
- a photoelectric converter for generating a signal electric charge and for holding a potential of the signal electric charge,
  - wherein the signal electric charge corresponds to an intensity of incident light;
- an amplifier unit including:
  - a first MOS transistor having a gate terminal connected to an output terminal of the photoelectric converter, the gate terminal configured to read out a held potential by the photoelectric converter, a drain terminal that serves as an output terminal, and a source terminal;
  - a voltage applier for applying a ramp waveform voltage to the source terminal of the first MOS transistor or to the output terminal of the photoelectric converter via a capacitative element;
  - a second MOS transistor having a gate terminal, the second MOS transistor being connected between an output signal line and a power supply line,
    - wherein the output signal line provides an output signal of the amplifier unit;
- a charge controller for charging a stray capacitance, having one end that is connected to the signal line by providing electrical conduction of the second MOS transistor before the ramp waveform voltage is applied,
  - wherein the charge controller is a circuit for applying a control voltage to the gate terminal of the second MOS transistor; and
- a signal converter for generating a binary signal having a pulse width corresponding to the held potential based on a voltage of the output signal line, the voltage being changed by discharging a charged electric charge of the stray capacitance via the first MOS transistor, when the ramp waveform voltage is applied to the source terminal of the first MOS transistor or to the output terminal of the photoelectric converter via the capacitative element by the voltage applier, while a potential to be read out is held in the photoelectric converter.

19. A signal readout method of a solid-state image sensor comprising:
- generating a signal electric charge using a photoelectric converter,
  - wherein the signal electric charge corresponds to an intensity of incident light;
- holding a potential of the signal electric charge using the photoelectric converter;
- providing an amplifier unit including a first MOS transistor having a gate terminal connected to an output terminal of the photoelectric converter, the gate terminal configured to read out a held potential by the photoelectric converter, a drain terminal that serves as an output terminal, and a source terminal;
- connecting a second MOS transistor between an output signal line and a power supply line, the second MOS transistor having a gate terminal;
  - wherein the output signal line provides an output signal of the amplifier unit;
- generating a binary signal using a signal converter,
  - wherein the binary signal has a pulse width corresponding to the held potential based on a voltage on the output signal line,
  - a stray capacitance has one end is connected to the signal line, and is charged by applying a predetermined control voltage to the gate terminal of the second MOS transistor to provide electrical conduction of the second MOS transistor before the ramp waveform voltage is applied by the voltage applier, and while a potential to be read out, which corresponds to an intensity of the incident light, is held in the photoelectric converter, and
  - the binary signal has a pulse width corresponding to the held potential, and is generated by the signal converter based on the voltage on the signal line, the voltage being changed by discharging a charged electric charge of the stray capacitance via the first MOS transistor in a changing process of the ramp waveform voltage; and
- applying the ramp waveform voltage to the source terminal of the first MOS transistor or to the output terminal of the photoelectric converter via the capacitative element, the ramp waveform voltage is applied using a voltage applier.

* * * * *